United States Patent
Jaekel et al.

(10) Patent No.: US 10,279,476 B2
(45) Date of Patent: May 7, 2019

(54) METHOD AND SYSTEM FOR PROGRAMMING A ROBOT

(71) Applicant: ArtiMinds Robotics GmbH, Karlsruhe (DE)

(72) Inventors: Rainer Jaekel, Ludwigsburg (DE); Gerhard Dirschl, Krautheim (DE)

(73) Assignee: ArtiMinds Robotics GmbH, Karlsruhe (DE)

( * ) Notice: Subject to any disclaimer, the term of this patent is extended or adjusted under 35 U.S.C. 154(b) by 9 days.

(21) Appl. No.: 15/313,219

(22) PCT Filed: May 15, 2015

(86) PCT No.: PCT/DE2015/200313
§ 371 (c)(1),
(2) Date: Nov. 22, 2016

(87) PCT Pub. No.: WO2015/185049
PCT Pub. Date: Dec. 10, 2015

(65) Prior Publication Data
US 2017/0190052 A1    Jul. 6, 2017

(30) Foreign Application Priority Data

Jun. 3, 2014 (DE) .................. 10 2014 210 525
Mar. 13, 2015 (DE) .................. 10 2015 204 641

(51) Int. Cl.
*B25J 9/16* (2006.01)
*G06N 20/00* (2019.01)
*G06F 17/50* (2006.01)

(52) U.S. Cl.
CPC ............. *B25J 9/1666* (2013.01); *B25J 9/163* (2013.01); *B25J 9/1658* (2013.01); *B25J 9/1664* (2013.01);
(Continued)

(58) Field of Classification Search
CPC combination set(s) only.
See application file for complete search history.

(56) References Cited

U.S. PATENT DOCUMENTS 5,530,791 A   6/1996 Okabayashi
6,718,229 B1  4/2004 Takebayashi et al.
(Continued)

FOREIGN PATENT DOCUMENTS

CN    1733435 A    2/2006
CN    101549495 A  10/2009
(Continued)

OTHER PUBLICATIONS

Berenson, Dmitry, et al., "Manipulation Planning on Constraint Manifolds", In Proceedings of IEEE International Conference on Robotics and Automation, May 12-17, 2009, 8 pages, retrieved from <http://www.ri.cmu.edu/pub_files/2009/5/berenson_dmitry_2009_2.pdf> on Oct. 20, 2016.
(Continued)

*Primary Examiner* — Adam R Mott
(74) *Attorney, Agent, or Firm* — Alston & Bird LLP

(57) ABSTRACT

The invention relates to a method for programming a robot, in particular a robot comprising a robotic arm, in which method a movement to be performed by the robot is set up preferably in a robot programme by means of a predefined motion template, the motion template is selected from a database comprising a plurality of motion templates, the motion template comprises one or more execution modules that can be parameterized and at least one learning module, the one or more execution modules are used for planning and/or performing the robot movement or part of the robot movement, the leaning module records one or more configurations of the robot during an initialization process, in particular in the form of a teaching process, and the learning module calculates parameters for the one or more execution (Continued)

modules on the basis of the recorded configurations, preferably using an automatic learning process. Also disclosed is a corresponding system for programming a robot.

20 Claims, 13 Drawing Sheets

(52) U.S. Cl.
CPC ........ *B25J 9/1671* (2013.01); *G06F 17/5009* (2013.01); *G06N 20/00* (2019.01); *G05B 2219/40517* (2013.01); *G05B 2219/40523* (2013.01)

(56) References Cited

U.S. PATENT DOCUMENTS

| | | | |
|---|---|---|---|
| 8,843,236 | B2 | 9/2014 | Barajas et al. |
| 2003/0095514 | A1 | 5/2003 | Sabe et al. |
| 2006/0030967 | A1 | 2/2006 | Ogawa et al. |
| 2009/0074252 | A1 | 3/2009 | Dariush et al. |
| 2010/0094461 | A1 | 4/2010 | Roth et al. |
| 2010/0286826 | A1 | 11/2010 | Tsusaka et al. |
| 2011/0208355 | A1 | 8/2011 | Tsusaka |
| 2012/0317535 | A1 | 12/2012 | Schmirgel et al. |
| 2013/0345870 | A1* | 12/2013 | Buehler ............... B25J 9/0087 700/257 |
| 2013/0345873 | A1* | 12/2013 | Blumberg ............ B25J 9/0087 700/259 |
| 2014/0298231 | A1* | 10/2014 | Saito .................... G06F 3/0484 715/771 |
| 2015/0336268 | A1* | 11/2015 | Payton ................... B25J 9/163 700/261 |

FOREIGN PATENT DOCUMENTS

| | | |
|---|---|---|
| CN | 102749919 A | 10/2012 |
| DE | 102004032996 A1 | 2/2006 |
| DE | 102008063680 A1 | 4/2010 |
| DE | 102010012598 A1 | 9/2011 |
| DE | 102013203381 A1 | 9/2013 |
| EP | 1724676 A1 | 11/2006 |
| JP | H05-127718 A | 5/1993 |
| JP | H09-325806 A | 12/1997 |
| JP | 2000-218576 A | 8/2000 |
| JP | 2002-189608 A | 7/2002 |
| JP | 2005-125475 A | 5/2005 |
| JP | 2006-289602 A | 10/2006 |
| JP | 2008-087109 A | 4/2008 |
| JP | 2010-137357 A | 6/2010 |
| JP | 2011-500349 A | 1/2011 |
| JP | 2011-238104 A | 11/2011 |
| JP | 2012-027607 A | 2/2012 |
| JP | 2012-206219 A | 10/2012 |
| WO | WO 2005/091090 A2 | 9/2005 |
| WO | WO 2006/043873 A1 | 4/2006 |
| WO | WO 2007/099511 A2 | 9/2007 |
| WO | WO 2009/107358 A1 | 9/2009 |
| WO | WO 2013/192490 A2 | 12/2013 |

OTHER PUBLICATIONS

Chen, Pang C., et al., "Generating Natural-Language Like Robot Motion Command Set Through Machine Learning", In Proceedings of IEEE International Conference on Systems, Man, and Cybernetics, Oct. 2-5, 1994, 6 pages, IEEE, U.S.

Chu, H., et al., "Integration of Task Planning and Motion Control in a Multi-Robot Assembly Workcell", *Robotics and Computer Integrated Manufacturing*, Jun. 1993, pp. 235-255, No. 3, Elsevier Science Publishers BV, Great Britain.

International Searching Authority, International Search Report (ISR) and Written Opinion for International Application No. PCT/DE2015/200313, dated Oct. 16, 2015, 16 pages, European Patent Office, Netherlands.

Stilman, Mike, "Task Constrained Motion Planning in Robot Joint Space", In Proceedings of IEEE/RSJ International Conference on Intelligent Robots and Systems, Oct. 29-Nov. 2, 2007, 8 pages, retrieved from <http://www.golems.org/papers/StilmanIROS07-task-constrained.pdf> on Oct. 20, 2016.

The International Bureau of WIPO, International Preliminary Report on Patentability (English Translation of Written Opinion) for International Application No. PCT/DE2015/200313, dated Dec. 6, 2016, 8 pages, Switzerland.

Maier, Christopher, "Aufbau und Einsatz von Industrierobotern (Construction and Use of Industrial Robots)", Vorlesungsskriptum 3. Auflage, Institut für Produktionstechnik, 1996, pp. 81-83.

Japan Patent Office, Notification of Reasons for Refusal for Application No. 2016-571289, dated Mar. 20, 2018, 9 pages, Japan.

Korean Intellectual Property Office, Notification of Reason for Refusal for Application No. 10-2016-7034098, dated Apr. 10, 2018, 8 pages, Republic of Korea.

State Intellectual Property Office of the P.R.C., First Office Action, including Search Report, for Application No. 201580029953.3, dated May 3, 2018, 10 pages.

Japan Patent Office, Notification of Reason for Refusal for Application No. 2016-571289, dated Dec. 11, 2018, 25 pages, Japan.

* cited by examiner

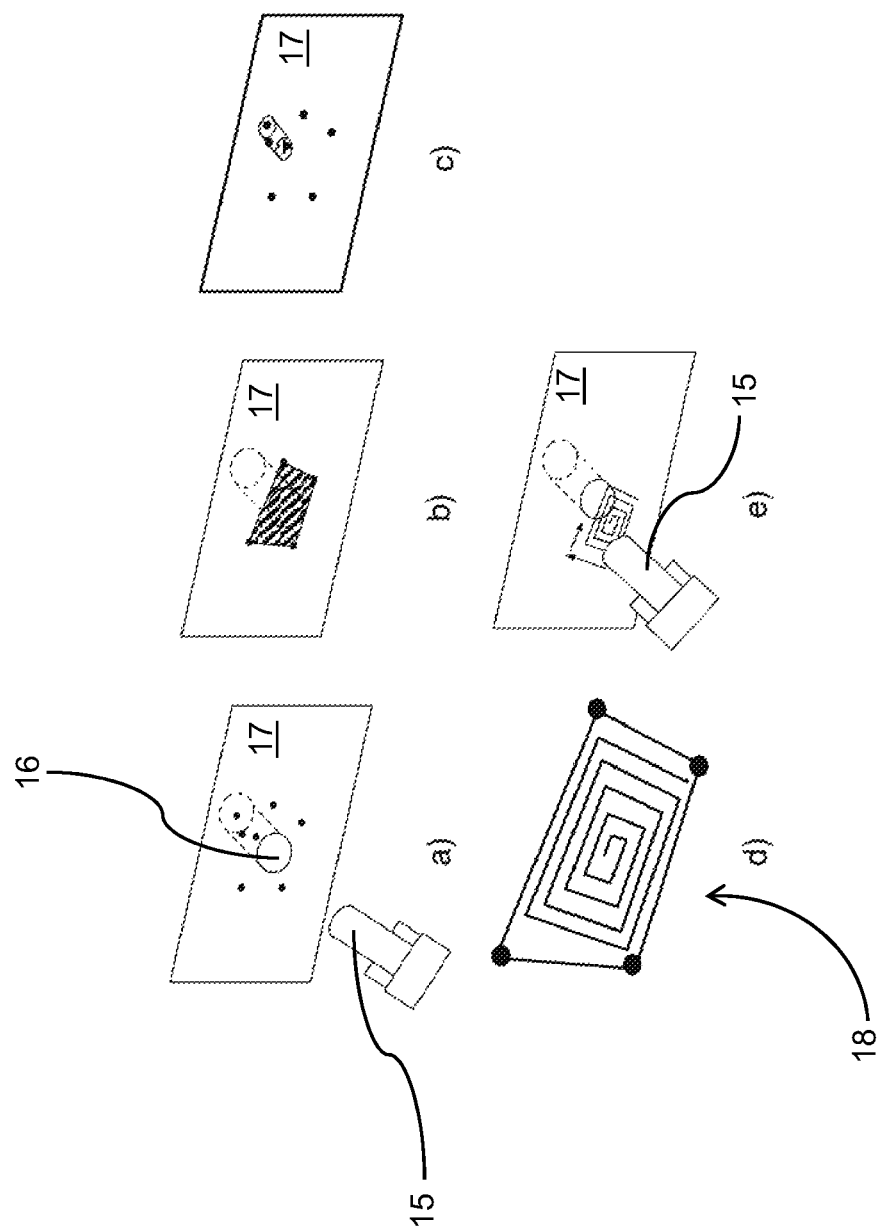

METHOD AND SYSTEM FOR PROGRAMMING A ROBOT

CROSS REFERENCE TO RELATED APPLICATIONS

This application is a national stage application, filed under 35 U.S.C. § 371, of International Application No. PCT/DE2015/200313, filed May 15, 2015, which claims priority to German Application No. 10 2015 204 641.9, filed Mar. 13, 2015, and German Application No. 10 2014 210 525.0, filed Jun. 3, 2014, the contents of all of which as are hereby incorporated by reference in their entirety.

BACKGROUND

Technical Field

The invention relates to a method and a system for programming a robot, in particular, a robot comprising a robot arm.

Description of Related Art

Methods and systems of the type under discussion have been known for many years from the field. As a result, there exists a variety of programming methods for programming industrial robots: teach-in, playback, sensor-based programming, CAD (computer-aided design) programming and dialog-based or textual programming.

In the teach-in programming method known from the field, the robot is programmed by manually approaching and saving various waypoints. The tool for this procedure is the teach panel, a remote controller with a graphics display, on which the robot state and the robot program can be shown. The user moves the robot to different points by steering the tool center point (TCP), a defined point on the last joint of the robot, in 3 or 6 spatial directions with, for example, a joystick. The user saves the coordinates of the various points that are approached and integrates this information into the robot program. In this case each waypoint is defined as a goal or intermediate point of a movement command, for example, a point-to-point, linear or circular movement. The operator enters additional path parameters by hand, for example, the speed, acceleration or blending with the next command. The construction of the robot program, i.e., in particular, the individual movement commands, can usually be chosen from a list and compiled.

In the case of the playback programming method known from the field, not only the individual points are saved, but the user can also move a robot arm on a continuous path, so that a large set of waypoints can be saved. This feature allows complex freeform paths, for example, along a fender of a vehicle, to be easily programmed that otherwise would be difficult to program with the individual movement commands of the teach-in programming method. The continuous lead-through is usually enabled by means of a force-torque sensor (FTS) at the robot flange: the human or, more specifically, an operator grasps the robot and exerts force on it. The forces are measured with the FTS and transmitted to the robot controller, which continuously computes a movement that compensates for the forces. This path is then assigned to one or more movement commands in the robot program.

In the sensor-based programming method, a continuous path is generated in a manner analogous to the playback method. However, additional sensors are used for this purpose, for, example, the projection of a laser line onto a component, the capturing of this line with a camera system and the conversion of the detected line into a motion path for the robot. In this case it is possible to achieve a high accuracy. The robot does not have to be moved directly, a feature that is advantageous in the case of large robots. However, additional hardware and calibration of the camera and the robot are necessary.

In contrast to these aforementioned on-line methods, in which the robot is programmed directly on site, in the CAD programming method a detailed CAD model of the work cell, the robot and the components to be manipulated is used to program the robot in a simulation environment. In this case the waypoints are determined by means of mouse interaction, for example, on the surface of the CAD model of the component. Or complete paths are calculated on the surface, for example, following the edges of the CAD model or following a particular pattern, for example, meandering. The points are mapped to point-to-point, linear or circular movement commands and saved to the robot program. Additional path parameters can be specified in a manner analogous to the teach-in programming method. The advantages include minimal effort to determine a path along the surface of objects, since the path can be calculated directly with the aid of the CAD model without requiring the use of the robot during the programming operation. However, the disadvantages include the calibration between the real work cell and the simulation, the provision of CAD models and the necessary adaptation for minor variances.

The common denominator of the above programming methods is the programming by means of waypoints and sequences of waypoints (paths) that can be generated graphically by means of various methods. One major disadvantage of individual waypoints, in particular, Cartesian waypoints is that they cannot be approached, for example, due to obstacles, singularities and/or the lack of accessibility in the case of minor variances, with the result that the robot program will fail.

In the dialog-based and textual programming methods known from the field, complete robot programs are created using a text editor or a graphics kit. In this case the full capabilities of the robot controller can be utilized. In particular, the analysis of robot external sensors can be used to respond to process variances caused, for example, by the visual localization of a component to be manipulated or by manufacturing tolerances. Programming directly in the robot programming language makes it possible to use additional movement commands that at the present time cannot be programmed by means of the aforementioned methods, for example, a force control using FTCtrl from KUKA or AdeptForce from Adept. In order to control the force, it is possible, for example, to specify the spatial directions for the feedback control, the desired values for the force/torque and simple termination constraints. From these basic commands very complex robot programs can be created. That being the case, even simple tasks, such as, for example, inserting a cylinder into a hole, may consist of several movement commands and a variety of force controllers. A typical assembly task is based on a multitude of such tasks, for example, inserting, screwing, hooking. Therefore, the implementation of an assembly task is associated with a great deal of effort. Furthermore, it is disadvantageous that expert knowledge about a robot programming language, the process and the robot are necessary.

Another problem is that at the present time the degree of automation is relatively low in the industry, even in the automotive sector. The majority of the applications that are automated using robot arms can be characterized by the fact that they move along rigidly programmed motion paths without a sensor-based response to variances. As a result, a tool, such as, for example, a welding gun, moves on the firmly programmed motion path. The variances in the process are reduced with a great deal of engineering effort and expense to a negligible level, for example, by means of special grippers for each component and special, high precision feeders. Only in this way is it possible to apply, if desired, a programming method with the assistance of teach-in or playback to generate the fixed motion path. If this is not economically feasible, then the conventional practice in most cases is to dispense with an automation by means of more complex programming methods.

The problem with this strategy is that this approach quickly reaches its limits, for example, due to the following problems:

Short production runs require frequent reprogramming, so that the high amount of engineering effort is uneconomical. For example, quality assurance tests of devices that change on a weekly cycle, for example, long term tests of washing machines, may be required.

Assembly tasks often have little play so that an interaction of forces, for example, during insertion of components, is unavoidable; and these assembly tasks consist of a multitude of different tasks, such as, for example, gripping, joining, contacting.

Resilient components have variations in their geometry, so that these geometrical variations have to be taken into consideration in the process, for example, a resilient sheet metal plate when gripping or joining plastic parts.

Objects, which are detected by means of visual sensors, for example, a screw for screwing, are at locations that are always different, for which reason the positioning of the robot has to be flexible.

Therefore, at the present time those tasks that cannot be programmed with fixed motion paths, for example, during assembly and quality assurance testing, are mostly performed by human workers.

BRIEF SUMMARY

Therefore, the object of the present invention is to design and further develop a method and a system for programming a robot of the type that is described in the introductory part of the specification in such a way that a simple and robust programming of the robot, in particular, for a manipulator and/or an assembly process, is made possible.

The above engineering object is achieved, according to the invention, by means of the features defined in patent claim 1, which discloses a method for programming a robot, in particular, a robot comprising a robot arm, in which method a movement to be performed by a robot is set up preferably in a robot program, by means of a predefined motion template, wherein the motion template is selected from a database, comprising a plurality of motion templates, wherein the motion template comprises one or more parameterizable execution modules and at least one learning module, wherein the one or more execution modules are used for planning and/or executing the robot movement or a partial movement of the robot movement, wherein the learning module records one or more configurations of the robot in an initialization process, in particular, in the form of a teaching process, and wherein the learning module calculates parameters for the one or more execution modules on the basis of the recorded configurations, preferably using a machine learning method.

Furthermore, the above engineering object is achieved by means of the features defined in the claims provided herein, which disclose a system for programming a robot, in particular, a robot comprising a robot arm, in which system a movement to be performed by a robot is set up, preferably in a robot program, by means of a predefined motion template, wherein the motion template can be selected from a database, comprising a plurality of motion templates, wherein the motion template comprises one or more parameterizable execution modules and at least one learning module, wherein the one or more execution modules are used for planning and/or executing the robot movement or a partial movement of the robot movement, wherein the learning module records one or more configurations of the robot in an initialization process, in particular, in the form of a teaching process, and wherein the learning module calculates parameters for the one or more execution modules on the basis of the recorded configurations, preferably using a machine learning method.

Finally the above engineering object is achieved by means of the features disclosed in the claims provided herein that relate to a computer program product.

First of all, it is recognized in an inventive manner that the development of robot programs, which are tolerant of variances in the positioning and geometry of objects, should be significantly simplified compared to dialog-based and textual programming in order to achieve the aforementioned engineering objects or should solve the aforementioned problems for automation—and possibly the associated advantages, such as, throughput, repeatability, quality, etc.—as efficiently as possible. By implementing tolerance to variances in the robot program, the overall amount of engineering effort can be significantly reduced, for example, by means of simple, standardized feeders and gripper systems that are also preferably suitable for human operators, so that automation becomes economically feasible.

According to the invention, in order to program a robot, in particular, a robot comprising a robot arm, a movement to be performed by a robot is set up, preferably in a robot program, by means of a predefined motion template. The motion template is selected from a database comprising a plurality of motion templates, wherein the motion template comprises, according to the invention, one or more parameterizable execution modules and at least one learning module. The one or more execution modules are used for planning and/or executing the robot movement or a partial movement of the robot movement. The learning module records one or more configurations of the robot in an initialization process, for example, in the form of a teaching process. Based on the recorded configurations, the learning module calculates parameters for the one or more execution modules, preferably using a machine learning method, such as, for example, the RANSAC algorithm or the principal component analysis.

The drawback with the traditional teach-in and playback programming methods is that only waypoints and paths can be generated, but not information as to whether or how these waypoints or paths would have to be adapted in order to tolerate or, more specifically, to compensate for variances.

In contrast to approaches that take into account variations during the execution of the motion paths by defining the movement corridors, the inventive method and the inventive system respectively can take into account that not only are there variations in the motion path, but that a variety of different variations, which occur, for example, due to the temporal change in the gripper positions and/or the measured forces and in various process steps, must also be taken into consideration.

Consequently the inventive method and the inventive system as well as the inventive computer program product make possible a simple and robust programming of a robot, in particular, for a manipulator process and/or an assembly process.

In an advantageous manner the parameters of the execution module(s) may include constraints, where in this case the robot movement or a partial movement of the robot movement is planned and/or executed on the basis of the constraints. Thus, the result is a variable and dynamic planning of a robot movement or a partial movement of the robot movement, so that it is possible to implement an execution of the robot movement that is as robust and flexible as possible, in particular, with respect to any variances in the movement.

In an additional advantageous manner a constraint may include a constraint function f and a constraint region R, where in this case the constraint function f maps a configuration k into a preferably real-valued vector space, and wherein the constraint region R corresponds to a subset of a preferably real-valued vector space. A constraint for a configuration k is satisfied, if f(k) is located in R. Thus, a uniform implementation of very different kinds of constraints is possible in a sophisticated way, an aspect that allows the path and the movement of the robot to be planned in an efficient way.

Furthermore, one or more of the following types may be used as a type for a constraint function f:
- angle, velocity and/or acceleration of the joint of the robot or an end effector, in particular, a gripper, of the robot;
- position, orientation and/or location of a tool center point of the robot relative to a coordinate system;
- velocity, angular velocity and/or twist measured at a tool center point relative to a coordinate system;
- force, torque and/or wrench measured at a tool center point relative to a coordinate system;
- freedom from collision, distance magnitude and/or distance vector from one CAD model to another CAD model;
- grip rating of an end effector, in particular, of a gripper, of the robot and a CAD model.

Thus, by using one of the above types, or by combining several of the aforementioned types for one or more constraint functions, it is possible to consider as comprehensively as possible and to compensate for various kinds of variances in the planning and execution of the robot movement.

In one advantageous embodiment a type that can be used for a constraint region R includes an axis aligned cube, an oriented cube, a cylinder, a cone, a sphere, a convex hull, a CAD model, an ORing, an ANDing and/or a product formation. The ORing, ANDing and product formation combine at least two constraint regions into a single constraint region. Thus, it is possible, depending on the application and type of a constraint function, to select the appropriate range of values through a suitable application of the appropriate type for the associated constraint region.

The parameters of the execution module(s) may advantageously include runtime constraints as the constraints, where in this case a runtime constraint is a time-dependent constraint that defines a constraint to be satisfied for a predeterminable interval of time points.

Furthermore, the parameters of the execution module(s) may include goal constraints as the constraints, where in this case a goal constraint is a constraint that defines a constraint to be satisfied for an upper interval limit of a or the predeterminable interval of time points.

Therefore, the set of runtime constraints and goal constraints of a constraint-based movement description can model—directly—admissible variances that may occur during the execution of a manipulator process or an assembly process. Furthermore, runtime constraints and goal constraints constitute information as to how to compensate for larger variances. This aspect represents a significant improvement over traditional programming methods that do not provide such information.

In one advantageous embodiment the one or more execution modules can adapt or, more specifically, adjust the robot movement or a partial movement of the robot movement in compliance with a control algorithm in such a way that the runtime constraints are observed. Furthermore, the robot movement or a partial movement of the robot movement can be successfully terminated, when the goal constraints are satisfied. Consequently a robot performs a movement with success, when all of the runtime and goal constraints specified for the motion path, are met. The robot will adapt his movement in compliance with the control algorithms in such a way that the runtime constraints are observed. As soon as the goal constraints are met, the movement is successfully terminated. Otherwise, the execution is not successful.

A motion path can be calculated in a particularly advantageous manner on the basis of the constraints, in particular, on the basis of the runtime and/or goal constraints, for the execution module(s) of the motion template, preferably using a path planning algorithm.

The one or more execution modules may be mapped in an advantageous manner by compiling to a target system, for example, a robot controller. For this purpose executable robot code can be created on the basis of the respective type of control, the calculated motion path as well as the runtime and goal constraints. Then the robot code can be fully executed independently in the respective target system.

Furthermore, it is conceivable that in the initialization process the configurations to be recorded can be generated by a user by means of various interfaces, for example, by means of a manual guiding of the robot by the user, by means of mouse interaction in a 3D simulation environment and/or by means of other suitable control means.

In an advantageous embodiment interaction with a user may be effected in the initialization process, where in this case questions and/or instructions are put to the user in order to generate the configurations to be recorded. As a result, the user can be effectively supported during the initialization process or, more specifically, during the teaching process.

With respect to a simple and efficient structuring, the one or more execution modules may be constructed hierarchically in such a way that an execution module is designed as an indivisible primitive operator, i.e., as a primitive execution module, or is composed of one or more execution modules and/or one or more motion templates. Thus, any already existing and possibly parameterized motion templates or execution modules can be reused efficiently.

The inventive method enables a robust setup of robot programs, which are tolerant of variances in the positioning of workpieces and their geometry, and can be used advantageously in industry.

Such robot programs are not created directly in the form of commands in the robot programming language (as opposed to dialog-based, textual programming), but rather can be created on the basis of a database of predefined motion templates in an initialization process or, more specifically, teaching process. The motion templates can be created, analogous to teach-in, on the basis of a few configurations for a given process.

The motion templates comprise preferably an executable rule to detect and optionally to compensate for any variances in the process performed by the robot. At the same time the interpolation methods, used in teach-in, for generating motion paths between waypoints can be supplemented by path planning methods that can generate motion paths between (implicitly defined) waypoint regions.

A few aspects of the invention are explained in more detail below with reference to an exemplary implementation. It should be explicitly noted that the following statements describe only particularly preferred exemplary embodiments, but the teaching is not to be regarded as limited to these exemplary embodiments.

The teaching process may include, as an initialization process, in particular, the following steps:

1. Adding a motion template from a database to a robot program (or to an empty robot program), for example, inserting, spiral search, advance and grasp, contacting. For each motion template there may be one set of execution modules and one learning module. Each execution module has parameters, preferably including runtime and goal constraints. In this case a primitive execution module can correspond to a particular control algorithm, where known controller implementations, such as, for example, a hybrid force/position control, are expanded. The learning module implements machine learning methods in order to create the parameters from the taught configurations and/or from dialog-based inputs.
2. The learning module is executed. It may be construed as an extension of the teach-in programming method, in particular, to include the creation of runtime and goal constraints. Depending on the type of learning module, the learning module can send questions (graphically: 3D visualization on robot controller/external PC, dialog-based: 2D visualization) to the user or, more specifically, to the operator in order to create specific configurations. Later the learning module will calculate the parameters of the execution modules from the configurations. The user creates these configurations using various interfaces, for example, by guiding the real robot or by mouse interaction in a 3D simulation environment. For example, the real robot is moved in four configurations, which are supposed to define the four corners of a rectangle, or the user marks the corresponding four points on a CAD model. The configurations are recorded, for example, by means of the sensors, which are integrated into the robot arm, and the external force/torque sensor (FTS).
3. Machine learning methods are implemented in the learning module of a motion template. These machine learning methods calculate the parameters of the execution modules from the recorded configurations, which may include the robot arm position and/or gripper position and/or the force/torque measurements and/or points on a CAD model.
4. Based on the parameters, a motion path can be calculated for each execution module of the motion template, preferably using path planning algorithms, for example, the rapidly exploring random tree algorithm. This step is analogous to the teach-in method, in which a continuous path, for example, a linear connection between two waypoints, is generated on the basis of waypoints subject to the selection of types of interpolation. In the present case, continuous paths are generated, based on constraints, in particular, runtime and goal constraints, using planning algorithms.
5. The execution modules with parameters can be mapped to a target system, i.e., a robot controller, for example, using compilation. For this purpose executable robot code is produced on the basis of the respective type of control, the calculated motion path as well as the runtime and goal constraints. Then the robot code can be fully executed on the respective target system. In an alternative implementation the execution modules, in particular, the primitive execution modules, can be executed directly on a computer or, more specifically, a PC-based controller, without conversion into robot code.

In contrast to the traditional teach-in or playback methods, the parameters of the execution modules do not have to be waypoints or motion paths, but rather may represent runtime and goal constraints, both of which can be uniformly defined as follows:

A constraint consists of a constraint function f (in German: Bedingungsfunktion), which maps a configuration k into a real-valued vector space, and a constraint region R (in German: Bedingungsregion), which corresponds to a subset of a real-valued vector space. A constraint for a configuration k is satisfied, if and only if f(k) is in R.

The following types can be used, for example, for a constraint function f:

angle, velocity and/or acceleration of the joint of the robot or an end effector, in particular, a gripper, of the robot;

position, orientation and/or location of a tool center point of the robot relative to a coordinate system;

velocity, angular velocity and/or twist measured at a tool center point relative to a coordinate system;

force, torque and/or wrench measured at a tool center point relative to a coordinate system;

freedom from collision, distance magnitude and/or distance vector from one CAD model to another CAD model;

grip rating of an end effector, in particular, of a gripper, of the robot and a CAD model.

With respect to a position constraint function, an orientation constraint function or a location constraint function (pose constraint), a constraint function f constitutes the current location of the tool point (tool center point TCP) relative to a specific (predefined) coordinate system K as a 3 dimensional vector (position constraint, orientation constraint) or as a 6 dimensional vector (location constraint).

In the context of one exemplary embodiment the calculation of the location constraint function consisting of a 3 dimensional vector of the position and a 3 dimensional vector of the orientation may be described as follows. Position and orientation constraints consist only of the respective 3 dimensional vector.

If H is the homogeneous transformation matrix that describes the location of the TCP relative to K, then the 6 dimensional vector is formed by the 3 dimensional translation vector of H and the 3 dimensional, scaled rotation axis of H (axis-angle representation). The scaled rotation axis of H can be calculated as follows:

1. The 3×3 rotation matrix of H is converted into a quaternion (qx, qy, qz, qw), where qw is the real part.
2. The angle of rotation a (alpha) is 2*acos (qw). Acos is the arc cosine function.
3. The scaled rotation axis is a*1/sin(a)*[qx qy qz]. [qx qy qz] is the 3 dimensional vector, consisting of qx, qy and qz.

A velocity constraint function, an angular velocity constraint function and a twist constraint function can be calculated in an analogous manner (twist=6 dimensional vector consisting of a 3 dimensional velocity vector and a 3 dimensional angular velocity vector). In this case, however, the 3 dimensional (translation) velocity and the 3 dimensional angular velocity of the TCP relative to a specific coordinate system K are transformed in accordance with the transformation rule for velocity vectors and saved as the value of the constraint function.

The force, torque and wrench constraint functions may also be treated in the same way as in the previous section. At the same time the force, the torque or the combination of force and torque (wrench) are calculated.

The joint angle constraint function, the joint velocity constraint function and the joint acceleration constraint function represent directly the n dimensional vectors of the current position, the velocity and the acceleration of the degrees of freedom of motion in the robotic system.

A freedom-from-collision constraint function can be implemented in such a way that it outputs 1 as the value, if there is a collision of the 3D CAD models of the surrounding area with the 3D CAD models of the robot or a collision of the robot with itself. This calculation of the collision can be carried out, inter alia, by intersecting the triangular meshes of the 3D CAD models, to which end, if necessary, the standard libraries may be used. If there is no collision, 0 is returned.

A distance magnitude constraint function calculates preferably the Euclidean distance of a 3D CAD model from a second 3D CAD model as the distance between the pair of points that complies with the two points of the first and second 3D model with the shortest possible distance from one another. A distance vector constraint function calculates preferably the normalized vector from the first to the second point of the same pair of points.

A location constraint may be realized or implemented, for example, as follows: let the coordinate system K be defined at the center of gravity of an object. Then the relative location of the TCP relative to K as a 6 dimensional vector is calculated according to the above formula. R is a 6 dimensional cube given as the center point vector [m1 m2 m3 m4 m5 m6] and the variance vector [e1 e2 e3 e4 e5 e6]. The cube complies with all of the vectors [v1 v2 v3 v4 v5 v6], where $m_i-e_i \le v_i \le m_i+e_i$. The constraint implies that the tool center point and, thus, also the robot arm position, has to be in a specific region, for example, above the object to be grasped. In this case the coordinate system K is defined at the center of gravity of the object. In this case possible values of R would be:

[m1 m2 m3 m4 m5 m6]=[0 0 0.05 1.5708 0 0]
and
[e1 e2 e3 e4 e5 e6]=[0.01 0.01 0 0 0 0].

The constraint region is located 0.05 m above the center of gravity of the object with an orientation of approx. 90 degrees, equivalent to 1.5708 rad, rotated about the X axis. Allowable deviations from this point are 0.01 m in the X and Y directions.

A force constraint (in German: Kraftbedingung) can be implemented as follows: the force measured with the FTS is shown as a 3 dimensional vector [fx fy fz]. The constraint region R is a 3 dimensional sphere R having a radius r and a center point vector [m1 m2 m3]. The force constraint is satisfied, if and only if [fx fy fz] is located in R, i.e., $$\mathrm{norm}([fx-m1, fy-m2, fz-m3]) \le r.$$

In this case norm is the Euclidean norm of the vector. Thus, the force constraint is satisfied, if and only if the amount of force is less than or equal to r.

In the context of a preferred embodiment of the invention a constraint function should or must satisfy one or more of the following calculations, where K is a configuration, and r is a real-valued vector with a dimension equal to the dimension of R(k):

1. $f(k)=r$, i.e., the function f can be applied to the configuration k. It must be fulfilled for all functions f.
2. $f^{-1}(r, k')=k$, i.e., if a value r and a reference configuration k' are given, then a configuration k that fulfills $f(k)=r$ can be calculated. (calculation B.1)
3. f(k) can be incremented by means of r, i.e., if a configuration k and a vector r are given, then a configuration k' can be calculated, so that $f(k')=f(f^{-1}(f(k)+r))$, i.e., the configuration k is modified in such a way that the modification corresponds to a given step r in R.

According to an exemplary embodiment, a constraint region defines a real-valued range of values R. In this case R should or must allow one or more of the following calculations. r is a real-valued vector with a dimension equal to the dimension of R:

1. Real-valued distance $d \ge 0$ from r to R: d is 0, if r in R, otherwise the minimum distance from r to the surface of R (calculation B.2).
2. Real-valued distance d from r to the surface of R: if r is in R, then d is the negative value of the minimum distance from r to the surface of R. Otherwise d is the minimum distance from r to the surface of R.
3. Include e=0 or 1. e is 1, if and only if r is in R. This calculation must be fulfilled by all of the constraint regions.
4. The center point m of R. This calculation must be fulfilled by all of the constraint regions.
5. Random point on the surface r. A random vector r can be calculated, so that r lies on the surface of R.
6. Random point from the internal space. A random vector r can be calculated, so that r is in
7. R. (calculation B.3)
8. Calculation of the extension of R in any direction v. (calculation B.4)

In this case the types of R that can be used include: axis aligned cube (axis aligned bounding box), oriented cube (oriented bounding box), cylinder, cone, sphere, convex hull, CAD model, ORing, ANDing and/or tupel formation.

As a result, the set of runtime constraints and goal constraints of a constraint-based movement description can model directly the allowable tolerances that can occur in the course of executing a robot program, for example, an assembly process. Furthermore, they represent information as to how to compensate for larger variances, an aspect that constitutes a significant improvement over traditional programming methods that do not provide such information.

A possible compensation for larger variances will be described in more detail below. In this case a distinction is made between motion planning and control.

In the context of motion planning the goal is to generate a motion path that satisfies a constraint-based movement description. In this case the algorithm constraint-based bidirectional rapidly exploring random tree (CBiRRT) by Berenson et al.: "*Manipulation Planning on Constraint Manifolds*", IEEE International Conference on Robotics and Automation (ICRA '09), May 2009, can be combined with the projection method randomized gradient descent (RGD) by Stilman, M: "*Task constrained motion planning in robot joint space*," Intelligent Robots and Systems, 2007, and can be adapted to the runtime and goal constraints. Then the path planning algorithm comprises the following steps:

1. Generating target configurations, i.e., configurations, for which all of the goal constraints are met. Since the set of target configurations generally include more than one element, the issue in this case concerns allowable deviations, for example, from a place at which the robotic system can put down an object.
2. Searching for a piecewise linear connection from a starting configuration to the generated target configurations. In this step a motion path is generated that runs from the starting configuration to one of the target configurations. As a result, the robotic system is able to independently generate a valid motion path within the variances that are given in the form of runtime constraints in a goal-oriented manner.

However, it is possible to provide initially, as a basis for the calculation of the target configurations and the search, a projection method that maps a configuration, in which not all of the constraints are satisfied, to a similar configuration that satisfies all of the constraints. To this end, a randomized gradient descent (RGD) can be implemented with constraints as the projection method. The goal is to map a configuration k to a configuration k', so that a given set of constraints in k' are satisfied, and k' is not further away from k than d>0. That means that, therefore, the proposed projection method allows a configuration k, in which a set of constraints are violated, to be modified at least until the constraints are met. In this respect the RGD algorithm is used with a special distance function.

The distance function dist( ) may be defined as follows: given the configuration k and a set of constraints b1 to bn:
1. Compute for each bi a distance value di: let f be the constraint function; and R, the constraint region of bi. If R supports the distance calculation (see calculation B.2), then it holds that di=minimum of MAX and distance of f(k) to R. If R does not support the distance calculation, then di=0, if f(k) is included in R. Otherwise, di=MAX. MAX is a constant>0, in the present case: 100,000.
2. Form the maximum dmax of all distance values di.
3. The value of the distance function for the configuration k is dmax.

The RGD algorithm projects a configuration k onto a configuration k', in which all of the constraints bi are satisfied by performing a randomized gradient descent. That being the case, the following process is performed. Let e be greater than 0 (e>0); and let k' be equal to k (k'=k) at the beginning:

Function bool RGD(k, bi, k'):
1. Set COUNTER=0
2. If COUNTER>MAXIMUM, terminate with the return value false.
3. Create after a uniform distribution m direction vectors si of the dimension of the configuration k. Set the configuration ki=k'+e*si. Compute vi=dist(ki) for all ki.
4. Determine the argument j with minimum value (argmin function) of all vi.
5. If vj=0, set k'=kj and terminate with return value true.
6. If vj>=dist(k), set COUNTER=COUNTER+1 and go to 2.
7. If norm(k-k')>d, set COUNTER=COUNTER+1 and go to 2.
8. Set k'=kj.
9. Go to 2.

Then the target configurations can be generated in a multistage process. Given bi=(fi, Ri) are the given goal constraints with constraint function fi and constraint region Ri:
1. Determine the constraints bj from bi, so that fj can be inverted (see calculation B.1) and Rj supports the calculation of random vectors (see calculation B.3).
2. Iterate through all bj:
   a. Compute a random value rj from Rj in accordance with calculation B.3.
   b. Compute kj=$^{-1}$(rj, k).
3. If RGD(k, bi, k') is true, then add k' to the set of target configurations.

With regard to the search for a piecewise linear connection from a starting configuration k0 to the set of target configurations kj, the CBiRRT algorithm can be used with the following modification: the step ConstrainConfig (kold, knew) is replaced by RGD (kold, bi(t), knew). In this case bi(t) are the runtime constraints at the time point t, which is incremented so as to keep pace with the planning process.

The end result of the path planning algorithm is a sequence of time points with configurations (t1, k1), ... , (tm, km), so that k1 corresponds to the starting configuration; and km to one of the target configurations from the set of target configurations. In this case the runtime constraints in k1 to km−1 are satisfied. The goal constraints in km are satisfied.

In order to provide a suitable control in accordance with an exemplary embodiment, the control algorithm hybrid position and force control can be further developed in order to be parameterized on the basis of the runtime and goal constraints. In this case the interpretation of the runtime and goal constraints is as follows:
1. Runtime constraints, which must be observed with the use of control
2. Goal constraints which interrupt, when they are met, the execution In the context of the exemplary embodiment, the control algorithm is provided, as a proportional-integral-differential controller (PID controller) implemented in the six dimensions x, y, z, rx, ry and rz. The major difference between the hybrid position controller and the force controller is in the error calculation, which replaces the selection rule that is commonly used. The control algorithm supports the runtime constraints with the position, orientation, location, force, torque or wrench constraint function. These constraint functions have a uniform construction and are based on the location or wrench at the TCP relative to a specific coordinate system K.

The update step of the PID controller can be implemented as follows:
1. Iterate through all runtime constraints.
2. Compute for the current configuration K the value f(k) of the constraint function f of the current runtime constraint.
3. The error calculation in the PID controller is carried out for each dimension, x, y, z, rx, ry and rz individually. In so doing, the following steps are carried out in each dimension i:
   a. Compute the distance d from f(k) to the center point of the region m at coordinate i.
   b. Compute in accordance with calculation B.4 the extension ai of the constraint region R in the direction that is given by i. At the same time it is explicitly possible that the extension is infinite, for example, in the case of a 2D plane.

c. If the amount di is less than ai, then set the error ei to 0. Otherwise, the error ei=ai−di.
d. Apply the PID update to the error ei and compute the desired value si.
4. Transform the target vector s=[s1 s2 s3 s4 s5 s6] into the TCP in accordance with the transformation rules of the constraint function.
5. If a force, torque or wrench constraint function is given, then convert the target vector with a given spring constant, according to the principle of the spring force, into a target location vector.
6. Compute the sum of the target vectors and transformed target location vectors of all runtime constraints.
7. Move the robot relative to the computed sum.

Hence, the robot performs either a position control, a force control or a simultaneous position and force control in a given dimension i as a function of the current runtime constraints.

The control process is terminated, when all of the goal constraints in the current configuration are met.

In addition, the control algorithms can be easily expanded to the use of goal constraints, for example, a position control in the joint angle space and/or in Cartesian space or a force control. In this case the current configuration k is calculated in the control loop. The control process is successfully terminated, when all of the goal constraints in k are met.

According to one exemplary embodiment of the invention, runtime and goal constraints constitute a particularly advantageous parameterization for generating motion paths by means of path planning and control, which can explicitly model the allowable variances and, therefore, can result in an increase in robustness. Programming by means of runtime and goal constraints is the preserve of only experts in robotics due to the algorithmic complexity. Therefore, the motion templates, which combine the execution modules with learning modules, are used in a sophisticated way. The execution modules can be parameterized by means of constraints, in particular, by means of runtime and goal constraints. Learning modules can use simple machine learning algorithms to generate runtime and goal constraints from a few configurations as the parameters for the execution modules. The learning module in itself represents a process that leads an operator step by step, for example, with the assistance of schematic representations of a few configurations, through the generation thereof. As a result, even non-experts can easily create robot programs for tasks that in the past required time consuming and complex textual programming of termination criteria or target criteria.

The movements of a robot are described by means of motion templates. A motion template consists of one or more execution modules and a learning module. Each execution module is either a primitive operator (basic operator), i.e., it cannot be broken down any further, or it consists of multiple execution modules (macro operator). That being the case, there are at least two classes of execution modules: controller (in German: Regler) and path planner (also motion planner). Path planners generate a motion path based on runtime and goal constraints. Controllers are of the type of the described position controllers in the joint angle space, position controllers in the Cartesian space, force controllers or expanded hybrid position/force controllers. Controller or, more specifically, closed loop controllers process the runtime and goal constraints, which are generated during execution of a motion path.

Execution modules can be parameterized by means of a set of runtime and/or goal constraints. The runtime and goal constraints, which are stored in the motion template, are preferably only partially parameterized. For each constraint not only the type of constraint function f, but also the type of constraint region R is fixed. The parameters of the constraint function are free, thus, for example, the coordinate system K for the location constraints or the location of the TCP. Similarly the parameters of the constraint region, i.e., for example, the center point, orientation and extension of an axis-oriented cube, are free. The free parameters are calculated by means of the learning modules.

The goal with regard to the interaction with a user or, more specifically, an operator as part of the initialization process or the teaching process is a schematic representation of the configuration to be generated, so that the user creates a semantically correct configuration for the calculation of the free parameters of the execution modules. For example, the user must establish contact with an object in order to enable a force measurement with the FTS.

The presentation is carried out in schematic form, since the motion templates are loosely defined and independent of the actual appearance of the objects, the gripper or, more specifically, the robot.

The schematic representation can be carried out in several ways:
1. presenting a video with a real and/or computer-animated representation of the execution of the motion template and/or the process of generating the configuration in a prototypical example of the motion template. In the latter case the individual steps, i.e., the individual configurations to be generated, are highlighted, for example, by pausing in the video.
2. using a dialog system to lead the user step by step through the process of generating a configuration, so that the user can take back configurations, which are already generated, and can repeat parts of the process. For each configuration to be generated, at least one dialog box is shown with a schematic visualization of the configuration which is to be generated, in a manner analogous to 1.

The free parameters can be computed by the learning modules based on the configurations Ti. In this case the type of constraint region and the constraint function are given.

If T1 to Tn are the configurations for computing the free parameters of the constraint b=(f, R), then it holds:
1. Compute f(T1), . . . f(Tn).
2. Specify a quality function g(Rp)>=0 that assigns a numeric value to a constraint region Rp without free parameters. In the work under discussion, g(R) =weighted sum of volume and surface of the region R.
3. Use a non-linear optimization method, for example, the Simplex or Rosenbrock algorithm to solve the following optimization problem: find values for the free parameters of R, so that Rp with respect to g(R) is minimal, and f(T1) to f(Tn) are included in Rp.

The use of a given learning module for a motion template, which is parameterized preferably to some extent, makes it possible to determine the runtime and goal constraints with only a small set of configurations, an aspect that leads to a reduction in the programming time, and at the same time makes it possible to check the process results, a feature that is required or, more specifically, is particularly advantageous for robust industrial use.

Compared to textual or dialog-based programming, the programmer does not have to enter directly the parameters of the movement commands; instead, these parameters are calculated automatically from the preceding teaching process.

Each type of control and each target system may have compiling rules that convert the execution module into executable robot code. In so doing, the evaluation of goal constraints is modeled directly in the robot code. Runtime constraints are simulated as a function of the type of controller. In the case of position controllers only runtime constraints that affect the location or joint angle of the robot arm are adjusted (for example, with the methods described above). In the case of force controllers, runtime constraints for the measured FTS values are adjusted. In the case of hybrid position/force control runtime constraints are considered for the position and FTS values. At the same time the constraint region R is analyzed to determine the spatial axes that are force or position controlled. An extension in a particular spatial axis greater than a threshold value is evaluated as an infinite extension. Spatial axes with an infinite extension are not position controlled in position constraints and are not force controlled in force constraints.

The inventive method and/or the inventive system and/or their various advantageous embodiments constitute an expansion of the traditional teach-in to include robot programs with the need to take account of variances. The result is an executable program that includes not only movement commands, as in the case of teach-in, but also in which a movement command still has preferably runtime and goal constraints. The integrated control algorithms change the robot movement as a function of the type of controller in order to observe the runtime constraints and to achieve the goal constraints. Thus, the possible advantageous embodiments described above make it easy to create robot programs with control strategies that otherwise can be created manually, and then only in a very time consuming way by means of dialog based or textual programming.

Thus, possible process steps include: teaching configurations based on templates, computing runtime and goal constraints, computing a prototypical motion path, mapping to control processes with runtime and goal constraints, compiling in order to generate robot code.

The aforesaid replaces an analogous process in the dialog-based or textual programming method, where the programmer develops a control process in the programming language and manually defines its parameters for a task at hand; he creates and parameterizes the target and termination constraints in the programming language. Starting poses and intermediate points are generated on the robot by means of teach-in.

In contrast, the inventive method and the inventive system and/or its advantageous embodiments make it possible to create complex robot programs in a faster way and at the same time with fewer demands on the operator, so that applications that have not been automated to date for economic or complexity reasons can now be automated. In addition, partial solutions that are generated, i.e., sets of parameterized motion templates, can be easily reused, because they can be easily adapted by modifying the individual configurations with the learning modules.

Specifically there is no longer any need in the case of the defined task profile, for example, an average assembly task, for the programmer to create by hand in a time consuming way the target and termination criteria for a large number of movement commands by means of a dialog-based or textual programming interface. Instead, this procedure is replaced by a simple and sophisticated creation of the robot program from a set of motion templates and, in addition, the teaching of a few, well-defined configurations for each learning module. The resulting robot program automatically includes the target criteria and the termination criteria in the form of runtime and goal constraints. Therefore, in contrast to teach-in or playback, a particular waypoint does not have to be approached, but rather the movement can be executed with success, if the constraints are met, i.e., for example, if a waypoint can be approached from a region, with the result that the execution is more flexible. In addition, information as to how to compensate for a variance is present in the form of constraints. Therefore, the robot program is tolerant of variances corresponding to the extension of the constraint region.

Some examples of advantageous definitions for use in the context of preferred embodiments of the invention are given below.

In the path planning literature, a configuration (in German: Konfiguration) is a unique and unambiguous description of the state of a robotic system. In the present case, therefore, a configuration may be given as an n dimensional, real-valued vector, which includes the following information:

the values of all controllable and non-controllable degrees of freedom in the robotic system, i.e., six joint angle values in a six-axis industrial robot the values of all controllable and non-controllable degrees of freedom in the tools mounted on the robot, i.e., a value for the gripper jaw position for an electric jaw gripper the values of the recorded sensor data of the sensors mounted on the robot, i.e., in the case of a six dimensional force-torque sensor three values for the forces, measured in the spatial direction x, y and z, as well as three values for the torques, measured in the spatial direction x, y and z a value for the time point t A configuration space (in German: Konfigurationsraum) is the set of all configurations that can occupy the robotic system. In this case physical boundary constraints, such as, for example, a controllable joint angle position, which leads to a self-collision of the robot, are ignored. If a configuration consists of n coordinates and each coordinate can assume values between $L_i$ and $U_i$, then the configuration space is defined as the hypercube with dimension n and edge lengths $U_i - L_i$ as well as center point $(L_i + U_i)/2$.

A motion path (motion) can be specified as a function b, which assigns a configuration to each point of the closed interval from 0 to 1 and is continuous. The value of b at the point 0 is the starting configuration. The value of b at the point 1 is the target configuration. Therefore, a motion path is a continuous connection in the configuration space.

A constraint (in German: Bedingung) can be specified as a function g that assigns the value of 0 or 1 to a configuration k. A constraint g is said to be satisfied in the configuration k, if and only if $g(k)=1$. Otherwise, the constraint has not been satisfied.

A runtime constraint (in German: Wahrendbedingung) can be specified as a time-dependent constraint. That is, it defines a constraint for each time point t. It is applied to the values of a motion path at the points greater than or equal to 0 and less than 1. A runtime constraint $g(t)$ on a motion path b is met, if and only if $g(t)(b(t))=1$ is for all $t>=0$ and $t<1$.

A goal constraint (in German: Zielbedingung) can be specified as a constraint that is applied to the value at the point 1 of a motion path. A goal constraint g on a motion path b is satisfied, if and only if $g(b(1))=1$.

A constraint-based movement description (also constraint-based motion representation) can be defined as a set of runtime constraints and a set of goal constraints. A motion path satisfies a constraint-based movement description, if all of the runtime constraints and all of the goal constraints on the motion path are met.

In the course of executing a robot movement using runtime and goal constraints, motion paths can be generated, for example, as follows: through the use of motion planning and/or through the use of control. In the case of motion planning, a motion path is generated before the execution on the robot. In the case of control, a motion path is generated by means of a control algorithm during execution. In so doing, the starting configuration is constant and corresponds to the beginning of the movement. The target configuration is always the current configuration, in which the robot finds itself at the current time. As a result, the path generated with a control algorithm grows steadily. A robot performs a movement with success, if all of the runtime and goal constraints given for the motion path are met. The robot will adapt its movement in compliance with the control algorithms in such a way that the runtime constraints are observed. As soon as the goal constraints are met, the movement is successfully terminated. Otherwise, the execution is not successful.

BRIEF DESCRIPTION OF THE FIGURES

There are now a variety of additional options for designing and further developing the teaching of the present invention in an advantageous way. To this end, reference is made, on the one hand, to the patent claims that are dependent on patent claim 1, and, on the other hand, to the following explanation of other preferred exemplary embodiments of the invention with reference to the drawings. In conjunction with the explanation of the preferred exemplary embodiments of the invention with reference to the drawings, preferred embodiments and further developments of the teaching are also explained in general. The drawings show in FIG. 1 a schematic view of an example of how a human would create a robot program by hand in order to accomplish the setting of a screw up to a predeterminable torque with a robot (prior art).

DETAILED DESCRIPTION OF VARIOUS EMBODIMENTS

The figures FIG. 1 to FIG. 12 comprise an example of a common application, i.e., the programming of a robot to screw a screw into a workpiece up to a specific torque by means of a robot.

Figure 1:
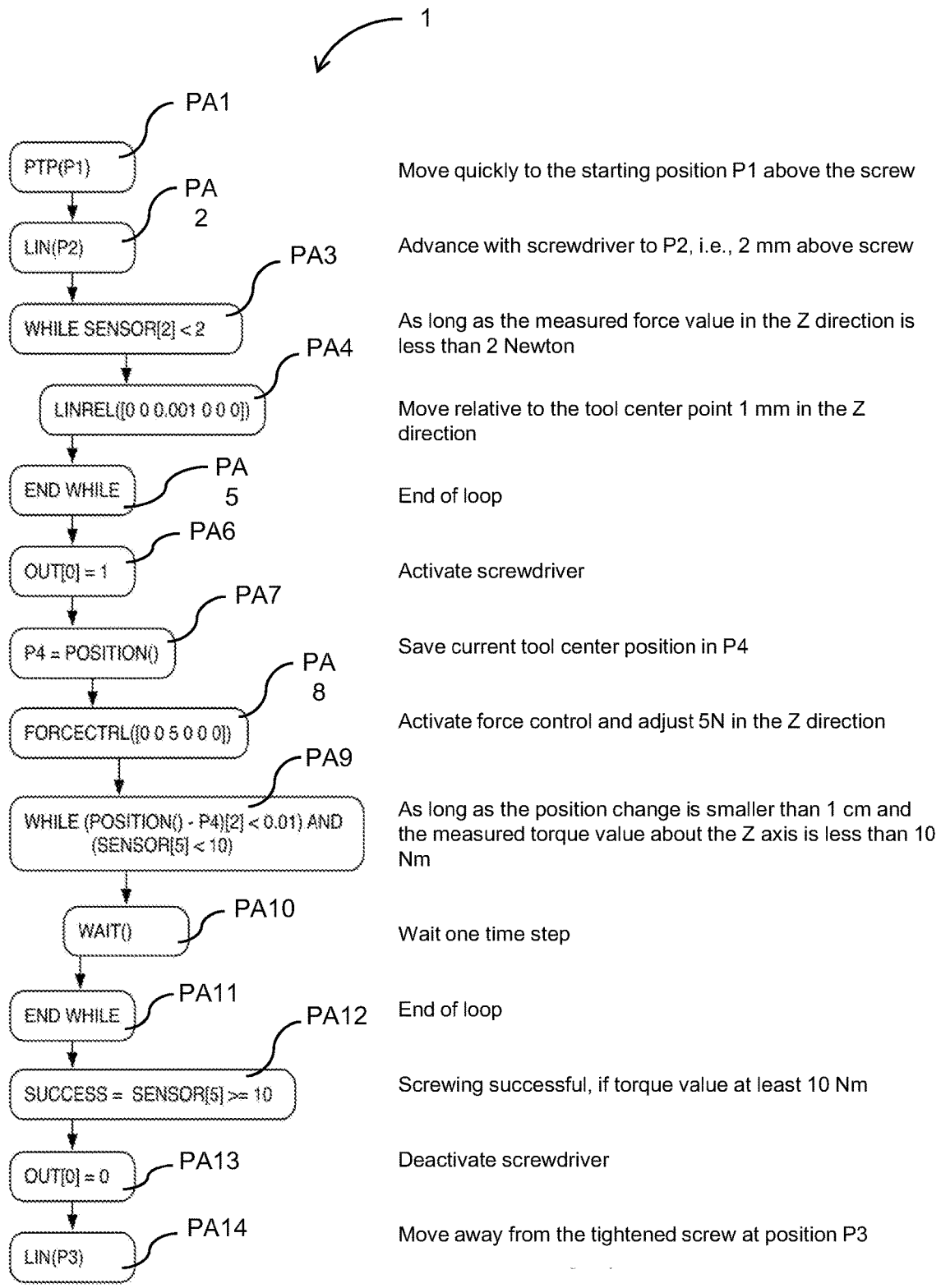

FIG. 1 shows a schematic view of an exemplary robot program 1 that a human would create manually, according to the prior art, to accomplish screwing a screw up to a pre-determinable torque with a robot. In the specific case the robot program 1 comprises, according to FIG. 1, instructions or robot commands, intended for executing/doing the said task, and, in particular, in the way that a human would have to manually program or create them at the present time. The boxes are individual robot commands with parameters. P1, P2, P3 and P4 are taught points that were manually integrated, preferably by the programmer, into the program as the parameters. SENSOR[2] reads the Z value of the force/torque sensor on the robot; SENSOR[5] reads the torque about Z. OUT[0]=1 or 0 activates or deactivates the screwdriver at the robot.

The robot program 1, which is shown as an example in FIG. 1, comprises the following program instructions PA1 to PA14:

PA1: Move quickly to the starting position P1 above the screw

PA2: Advance with screwdriver to P2, i.e., 2 mm above screw

PA3: As long as the measured force value in the Z direction is less than 2 Newton PA4: Move relative to the tool center point 1 mm in the Z direction PA5: End of loop PA6: Activate screwdriver PA7: Save current tool center position in P4

PA8: Activate force control and adjust 5N in the Z direction

PA9: As long as the position change is smaller than 1 cm and the measured torque value about the Z axis is less than 10 Nm PA10: Wait one time step PA11: End of loop PA12: Screwing successful, if torque value at least 10 Nm PA13: Deactivate screwdriver PA14: Depart from the tightened screw at position P3

According to the example from FIG. 1, the programmer or, more specifically, the person has to consider or rather select the structure of the program and the individual parameters, such as "<2", "<0.01", "<10", etc. A teach panel allows the programmer to approach intermediate points and to insert them into the program, in particular, the points P1 to P4. A great deal of effort is required to define the structure of the program and to define the various termination criteria.

Figure 2:
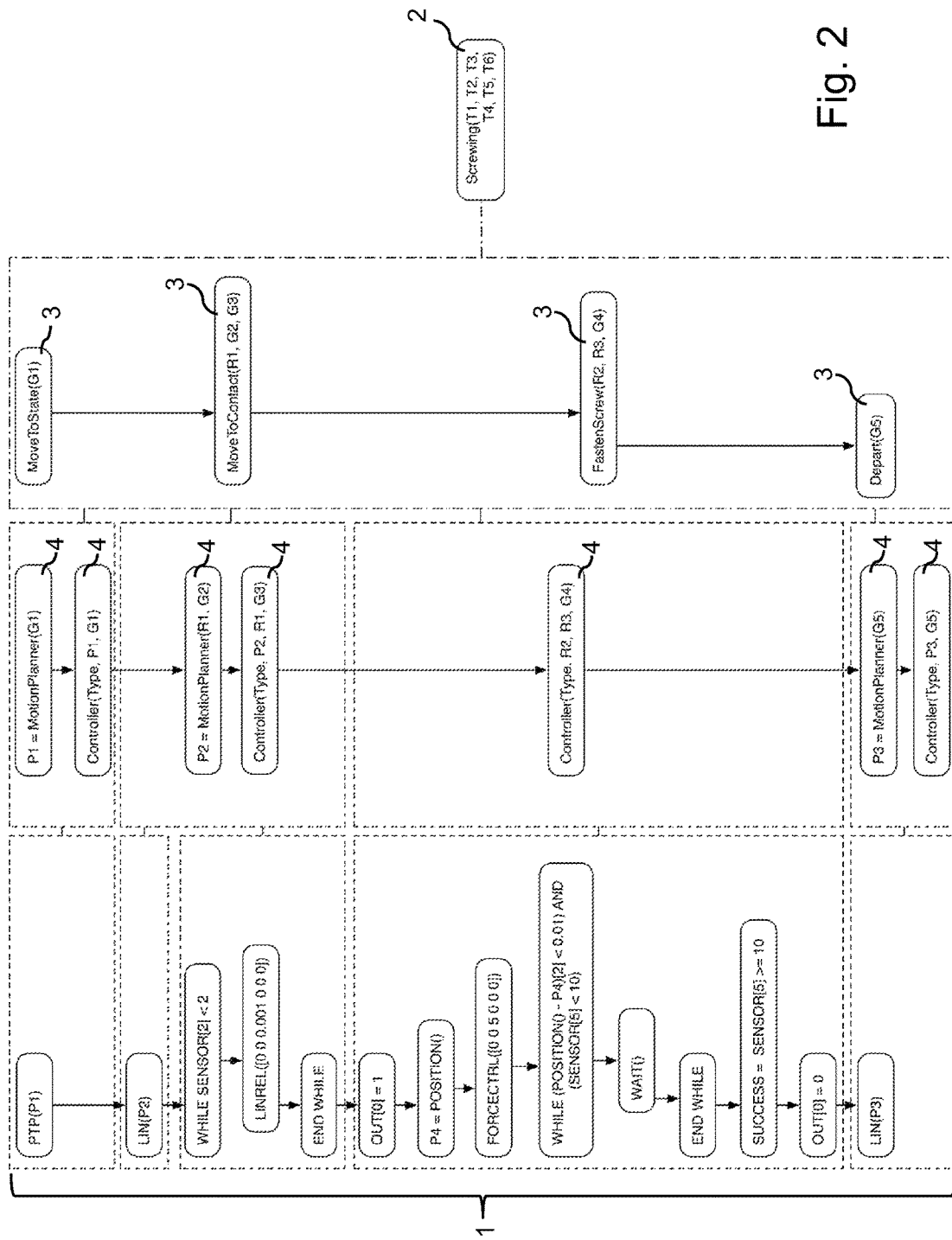
FIG. 2 a schematic view of an embodiment of a method or a system of the invention, where the hierarchical structure, in particular, during a compiling process, of a motion template is indicated.

FIG. 2 shows a schematic view of an exemplary embodiment of a method or system of the invention, where the hierarchical structure of a motion template 2 ("screwing"), in particular during a compiling process, is indicated. Thus, FIG. 2 shows how the robot program source code can be automatically generated step by step from the motion templates in a compiling process without textual programming. Usually the source code that is generated does not correspond exactly to what a human would write/create. In FIG. 2 this situation has been assumed for purposes of simplicity.

The motion template 2, shown on the right in FIG. 2, consists of several execution modules 3. In principle, each of the execution modules 3 can comprise in turn a motion template or one or more execution modules 4 (hierarchical representation). This feature allows subroutines to be represented and reused.

At the lowest level there are execution modules that are not broken down any further. Included are commands that are typical of robot programs, such as, for example, inputs/outputs of the controller. Relevant for the compiling process is the execution module controller that is used. Type refers to the type of controller, in particular, the position control, the force control, or the hybrid position/force control. Ri and Gi are the runtime constraints and the goal constraints respectively. The controller of each type is implemented in such a way that the runtime constraints Ri are to be observed and the goal constraints Gi are to be achieved. For the execution modules of this level and the types of runtime and goal constraints the rules are saved as to how these constraints can be mapped to executable robot program source code for each target robot controller. After calculating all of the parameters, these rules are applied in order to generate the executable source code.

Figure 3:
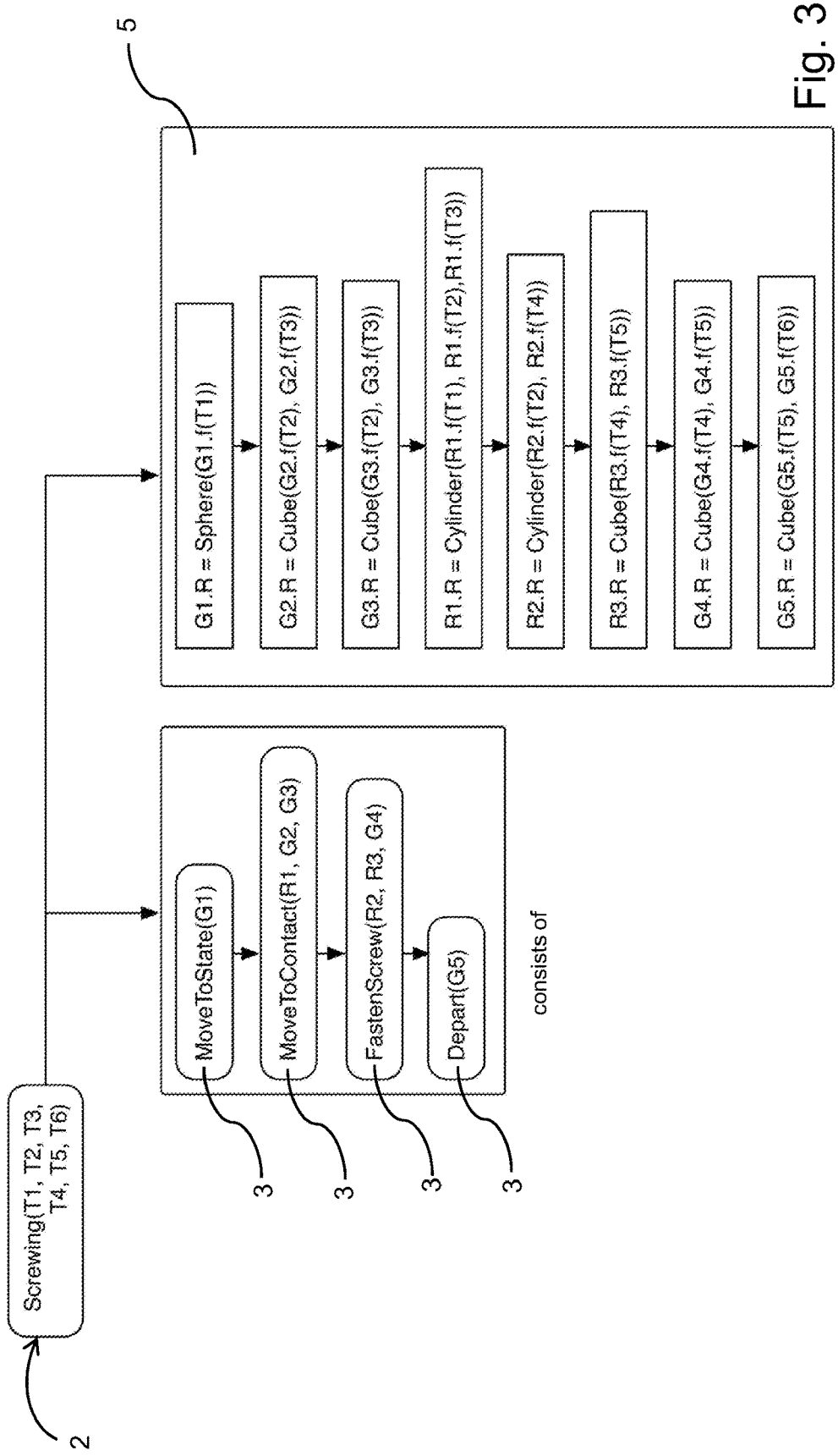
FIG. 3 a schematic view of the construction as well as the parameters of a motion template in accordance with an exemplary embodiment of a method or system of the invention.

FIG. 3 shows a schematic view of the structure and parameters of a motion template 2 ("screwing") in accordance with an exemplary embodiment of a method or system of the invention. The motion template 2 consists of the execution modules 3, the structural information (see arrows over connections in the graph) regarding the sequence of the execution modules 3 and a learning module 5. The execution modules 3 can consist hierarchically of additional execution modules (or preferably motion templates).

The parameters T1 to T6 of the motion template 2 are configurations that include or comprise variable degrees of freedom, preferably all of the variable degrees of freedom, in the robotic system (for example, arm position, gripper position), sensor data (for example, force/torque measurements) and reference points on CAD models (for example, contact points on a 3D model).

The structure of the execution modules reflects the order of execution of the robot program source code that is generated therefrom and corresponds to the real order of execution.

Learning modules are executed according to their structure and calculate the parameters of the execution modules, i.e., in particular, the runtime constraints Ri and the goal constraints Gj, from the configurations T1-Tn. In this context B.f denotes the constraint function of the constraint B; and B.R, the constraint region of the constraint B.

In the specific case a motion template 2 ("screwing") may consist, according to the exemplary embodiment shown in FIG. 3, of the execution modules 3, i.e., MoveToState, MoveToContact, FastenScrew and Depart. In general terms the parameters of the execution modules 3 are the runtime constraints (Ri) and the goal constraints (Gi). These runtime and goal constraints are computed step by step by means of predefined functions of the learning module.

The execution module MoveToState in FIG. 3 has only one goal constraint G1. This goal constraint has a constraint function f of the type joint angle constraint, i.e., for a configuration k, f(k) is the real-valued vector consisting of all of the joint angle values of the robot, as well as a constraint region R of the type sphere having a center point corresponding to the taught configuration T1 above the screw and a radius corresponding to the inaccuracy of the robot joint position sensor, for example, 0.0001 RAD.

MoveToState consists internally of a path planning execution module "Motion Planner" (see FIG. 2) and a controller execution module "Controller". The path planning execution module computes, with the defined path planning process, a motion path P1 from the starting configuration to a configuration that satisfies the goal constraint G1, i.e., except for the inaccuracy of the robot joint position sensor approaches the taught configuration T1. Then the computed motion path is executed with the controller of the type position controller and is successful, when the last configuration, measured by the robot joint position sensors, satisfies the goal constraint. As a result, the robot moves from the current configuration to the configuration, in which the screwdriver is positioned above the screw.

The execution module MoveToContact, according to FIG. 3, has the runtime constraint R1 and the goal constraints G2 and G3. It consists of one path planning execution module and two control execution modules. The runtime constraint R1 describes the linear movement from the configuration above the screw to a configuration, in which the screwdriver makes contact with the screw. The constraint function is a location constraint function that restricts the TCP relative to the coordinate system that corresponds exactly to the location of the TCP in the starting configuration. The constraint region is a cube, which is calculated from the configurations T1, T2 and T3 that are taught in an initialization process. That means that the extension in the direction of the screw corresponds in the length to the path traveled from the configuration above the screw (T1) to the configuration in contact with the screw (T2 and T3). The extension orthogonal thereto corresponds to the deviation, which the human has taught from T1 to T2 and T3, from the linear movement. G2 is a location constraint with the same constraint function as R1, but with a different constraint region. The constraint region is a cube that has minimal extension and comprises the values of the constraint function at T2 and T3.

The uniform, complex parameterization of the execution modules with runtime and goal constraints makes it possible to provide a uniform machine learning method for generating these parameters from the taught configurations.

The goal of learning module 5 of motion template 2 is to create the parameters of the execution modules 3, which are given in the form of runtime and goal constraints, from a few configurations. Since configurations can be generated by means of multiple, intuitive input channels, the net result is a much simpler programming method than the textual programming method, which in functional terms can generate comparable robot programs (with termination criteria and controllers). The advantage over conventional methods, known from the field, lies in the minimal number of configurations (or even training examples in the machine learning literature) that are necessary for generating relatively complex robot programs. This aspect is made possible by storing explicit rules for calculating the free parameters of the runtime and goal constraints early in the action description, in particular, in the description of the motion template. In the present case these rules are represented as the individual process steps that are executed in the learning module 5.

A set of process steps are defined in the learning module; and each of these process steps computes, based on a set of configurations, see T1 to T6 in FIG. 3, a runtime or goal constraint. Then these runtime and goal constraints are used as the input for the execution modules.

According to the example from FIG. 3, the execution module MoveToContact has three parameters, i.e., the runtime constraint R1 and the goal constraints G2 and G3. R1 is a location constraint with the cylinder type of constraint region. The free parameters of R1, i.e., the location of the center point of the cylinder, its height and radius, are calculated from the configurations T1, T2 and T3. For this purpose the constraint function f is applied to T1, T2 and T2 with the result R1·f(T1), R1·f(T2), R1·f1(T3). At the same time the function cylinder (A1, A2, An) that is applied computes the free parameters of the constraint region from the vectors A1 to An using an optimization algorithm. The computed cylinder approximates the movement which the TCP has to perform on the way to the contact point.

According to the approach of an exemplary embodiment of the inventive method, most of the structure is generated by means of the execution modules of the motion templates. The termination criteria are defined automatically with the assistance of the runtime and goal constraints that are calculated from the taught configurations.

Figure 4:
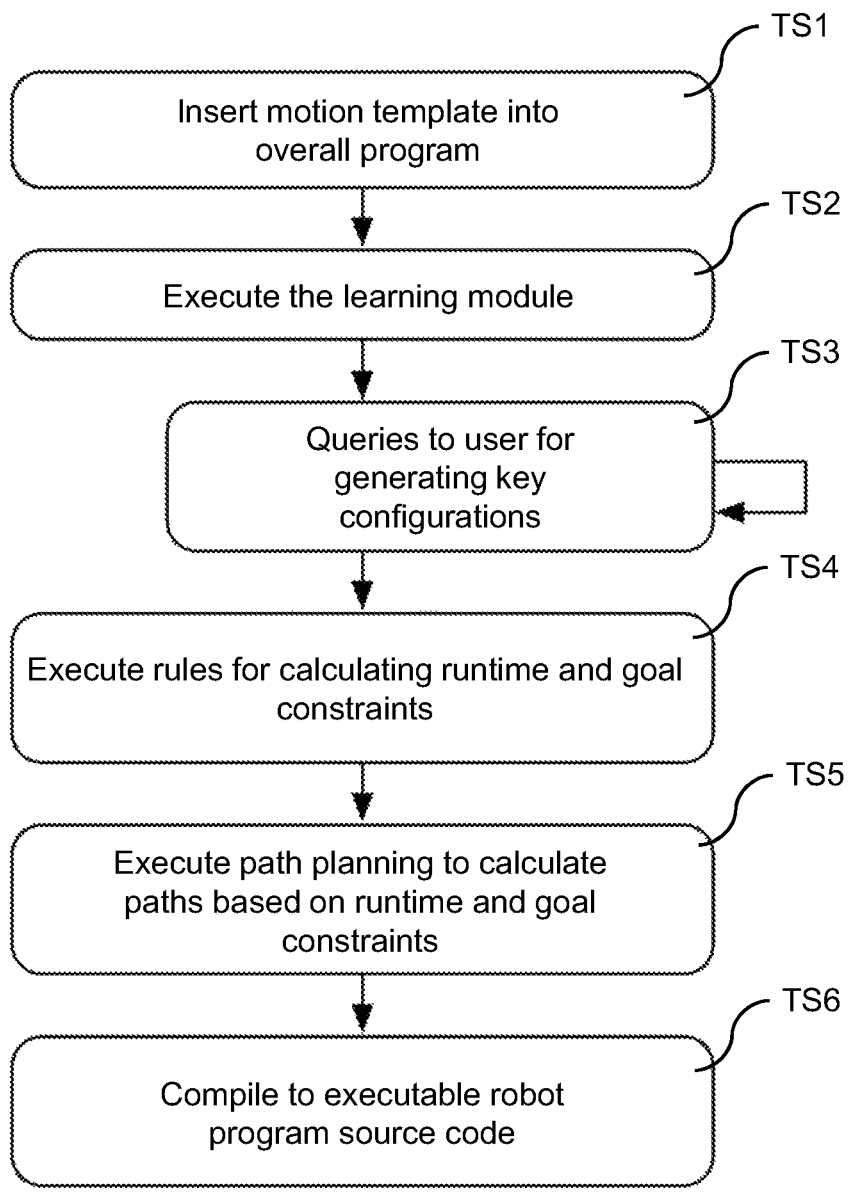
FIG. 4 a schematic view of a programming process in accordance with an exemplary embodiment of a method or system of the invention.
Figure 5:
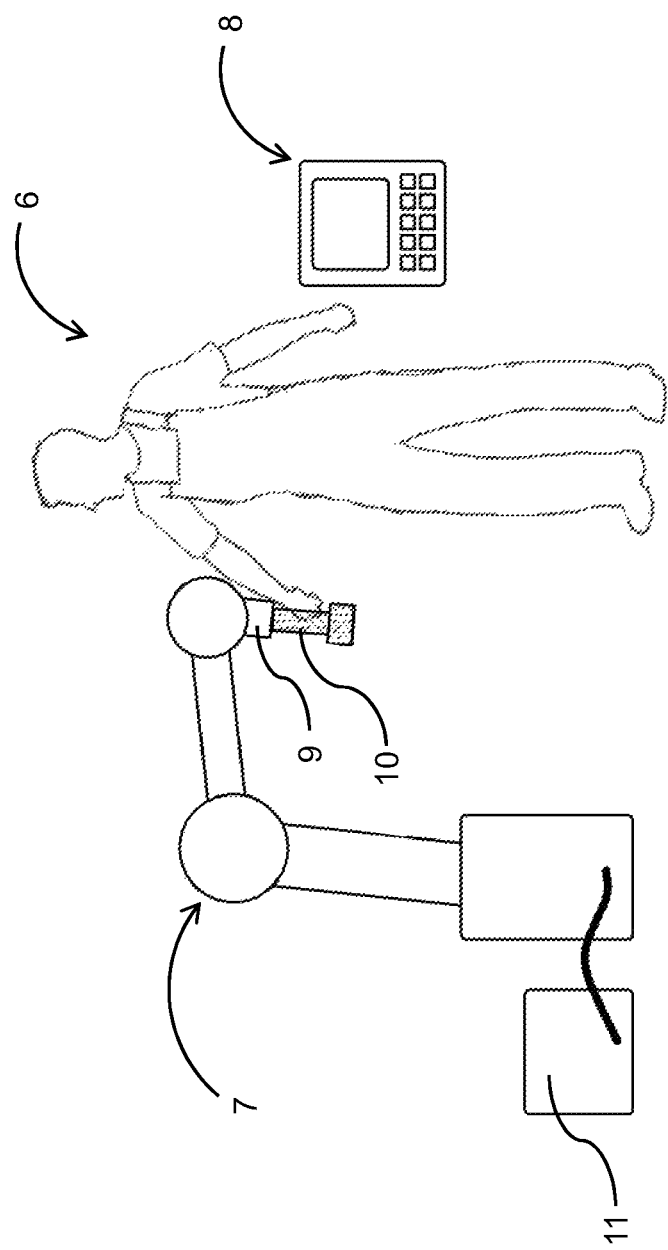
FIG. 5 a schematic view of individual components for programming a robot program, in particular, with runtime and goal constraints, by teaching in accordance with an exemplary embodiment of a method or system of the invention.

FIG. 4 shows a list of a programming process in accordance with an exemplary embodiment of a method or system of the invention. The programming process comprises the following substeps TS1 to TS6:

TS1: Insert motion template into overall program
TS2: Execute the learning module
TS3: Queries to user for generating key configurations
TS4: Execute rules for calculating runtime and goal constraints
TS5: Execute path planning to calculate paths based on runtime and goal constraints
TS6: Compile to executable robot program source code FIG. 5 shows the visualization of the components that are employed. An operator 6 generates configurations directly on the robot 7 and by means of a computer/PC 8 (at points on the CAD model). The robot 7 has one or more sensors 9 and a screwdriver 10 to perceive the surrounding area (for example, forces or visually). With the help of the computer/PC 8 the source code is created for the robot controller 11; and this source code can run on said controller or on the robot 7.

The figures FIG. 6, FIG. 7, FIG. 8, FIG. 9 and FIG. 10 show the visualization of the configurations T1-T6 that are generated by an operator and that are intended for programming the robot 7 for screwing in accordance with field of application shown in FIG. 5.

Figure 6:
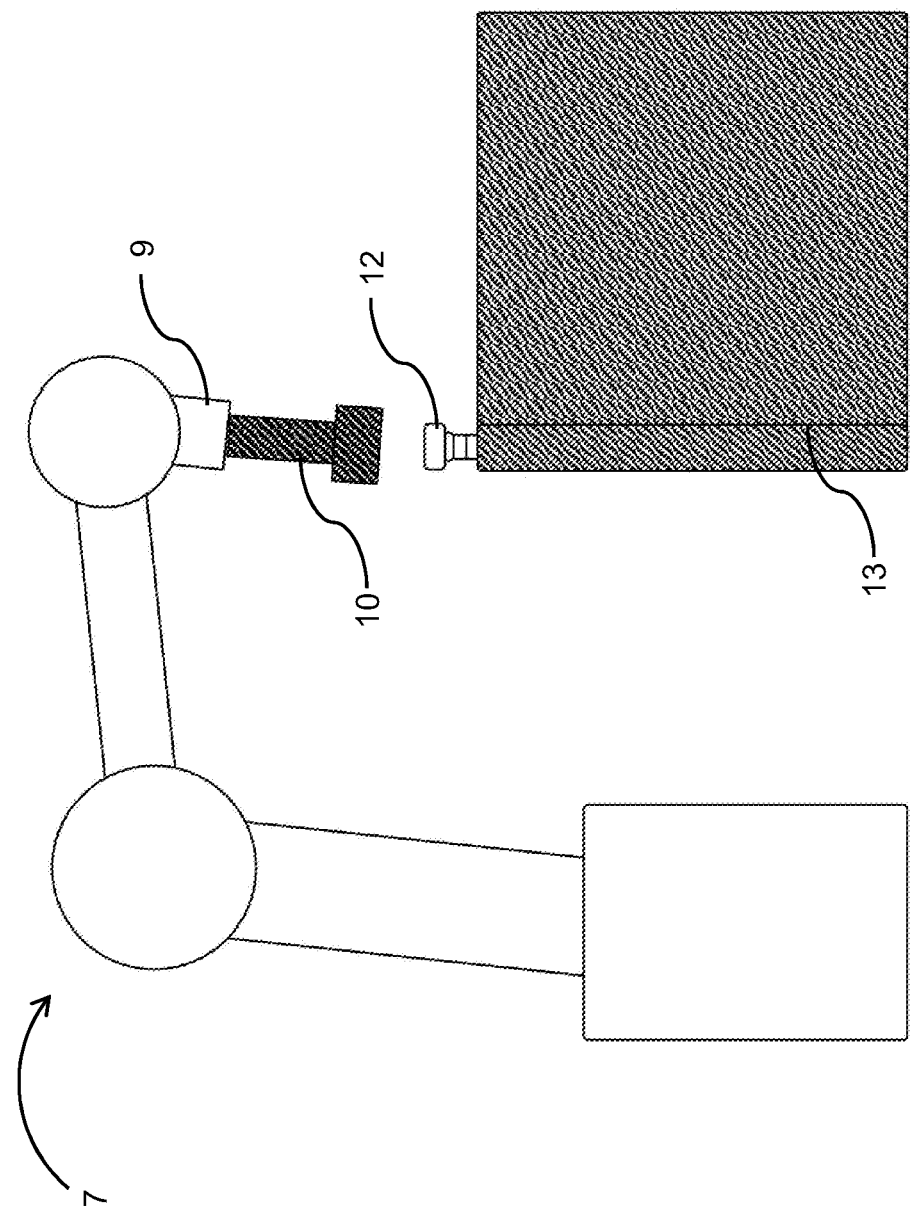
FIGS. 6 to 10 a schematic view of an initialization process or, more specifically, a teaching process—according to an exemplary embodiment of a method or system of the invention—for recording configurations for a screwing operation, where said configurations are generated by an operator.

FIG. 6 shows the start of the process, i.e., the initialization process or, more specifically, the teaching process, where in this case in order to perform the work operation, the robot 7 is to be programmed in such a way that a screw 12 is screwed into a workpiece 13 with the robot 7, which comprises a sensor 9 and a screwdriver 10.

Figure 7:
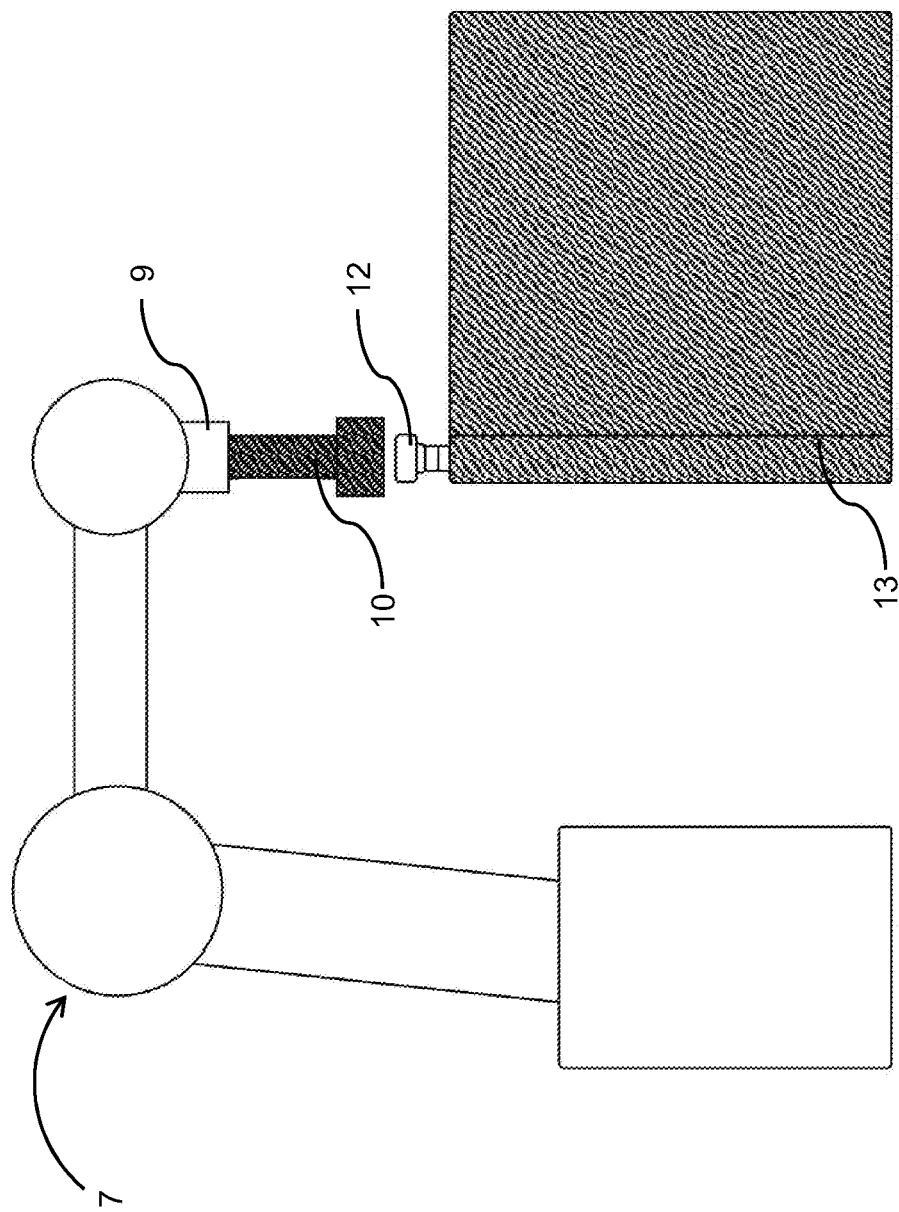

According to FIG. 7, the operator guides the screwdriver 10 directly above the screw 12 without contact, so that the configuration T1 is recorded. The goal constraint G1 with predefined type of constraint function f=joint angle constraint function and type of constraint region R=sphere is calculated from the configuration T1. The function sphere calculates, according to a quality criterion, the optimal sphere that envelops the configuration T1.

$$G1.R = \text{Sphere}(G1.f(T1))$$

The goal constraint G1 implies that the robot is to take precisely this arm position.

Figure 8:
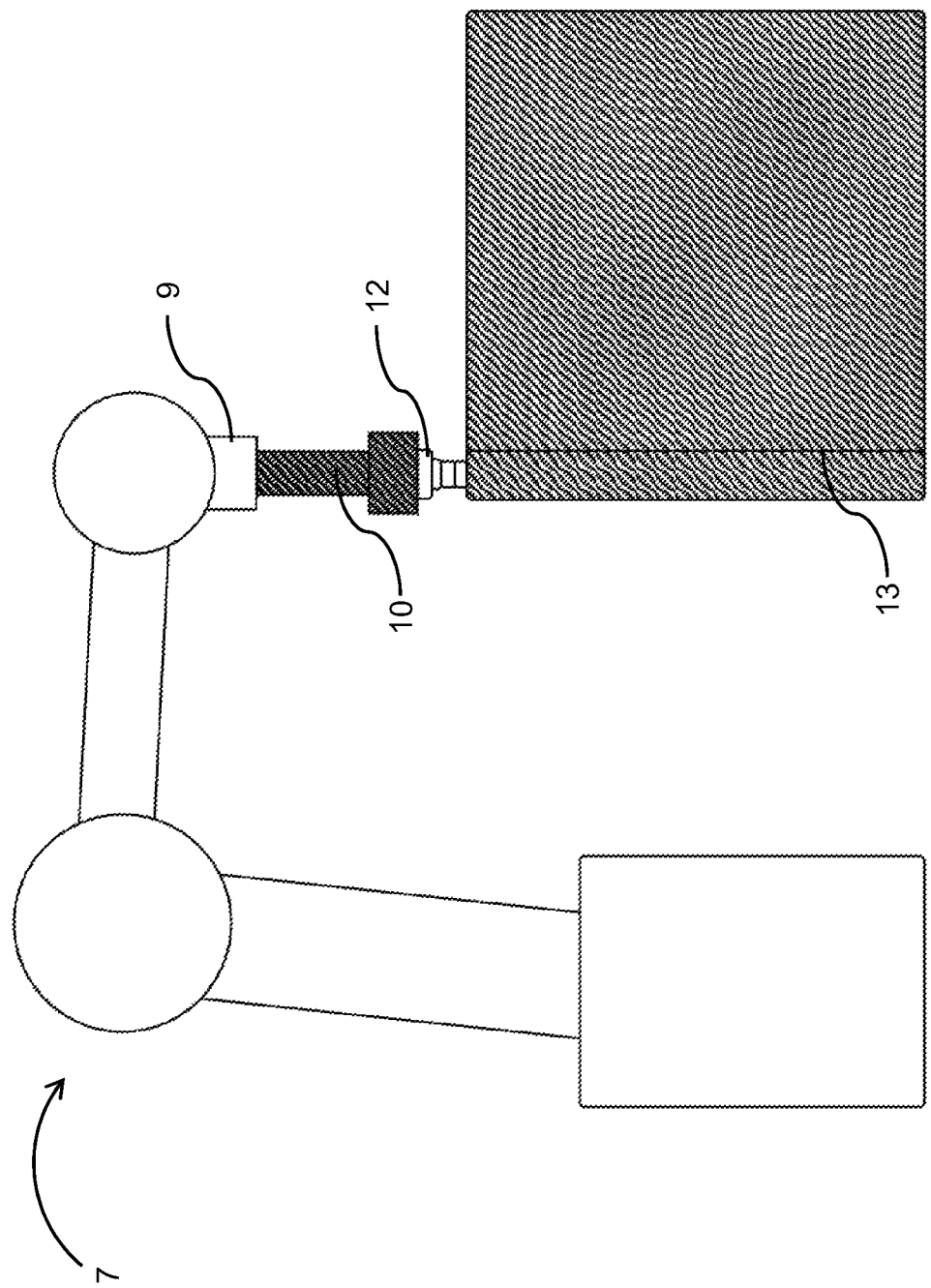

According to FIG. 8, the operator guides the robot 7 to make contact with the screw 12. The operator records two redundant configurations T2 and T3. The two (possibly also more) configurations are used to compute the goal constraint G3 for the force in the course of moving to make contact with the screw. The type of constraint function is the force constraint function with the tool center point TCP in the tip of the screwdriver 10 and the coordinate system exactly equal to the location of the TCP in the starting configuration, i.e., T2. The type of constraint region is the cube.

The function cube computes, based on the values of the constraint function for T2 and T3, i.e., the measured forces transformed into the TCP, the constraint region of G3:

$$G3.R = \text{Cube}(G3.f(T2), G3.f(T3))$$

In addition, the direction of movement is computed from the difference between the previous configurations T1 and T3 and is stored as a runtime constraint. That is, the robot 7 has to move in the direction taught.

For the values of the constraint function in T1, T2 and T3 the function cylinder computes the optimal cylinder, which contains these values. In this case R1.f is a location constraint function.

$$R1.R = \text{Cylinder}(R1.f(T1), R1.f(T2), F1.f(T3))$$

The goal constraint G2 is calculated in an analogous manner. However, the type of constraint region is the cube.

$$G2.R = \text{Cube}(G2.f(T2), G2.f(T3))$$

G2 is used to calculate the movement to the contact point. When executing, the calculated movement is executed and terminated successfully if G3 is satisfied.

Figure 9:
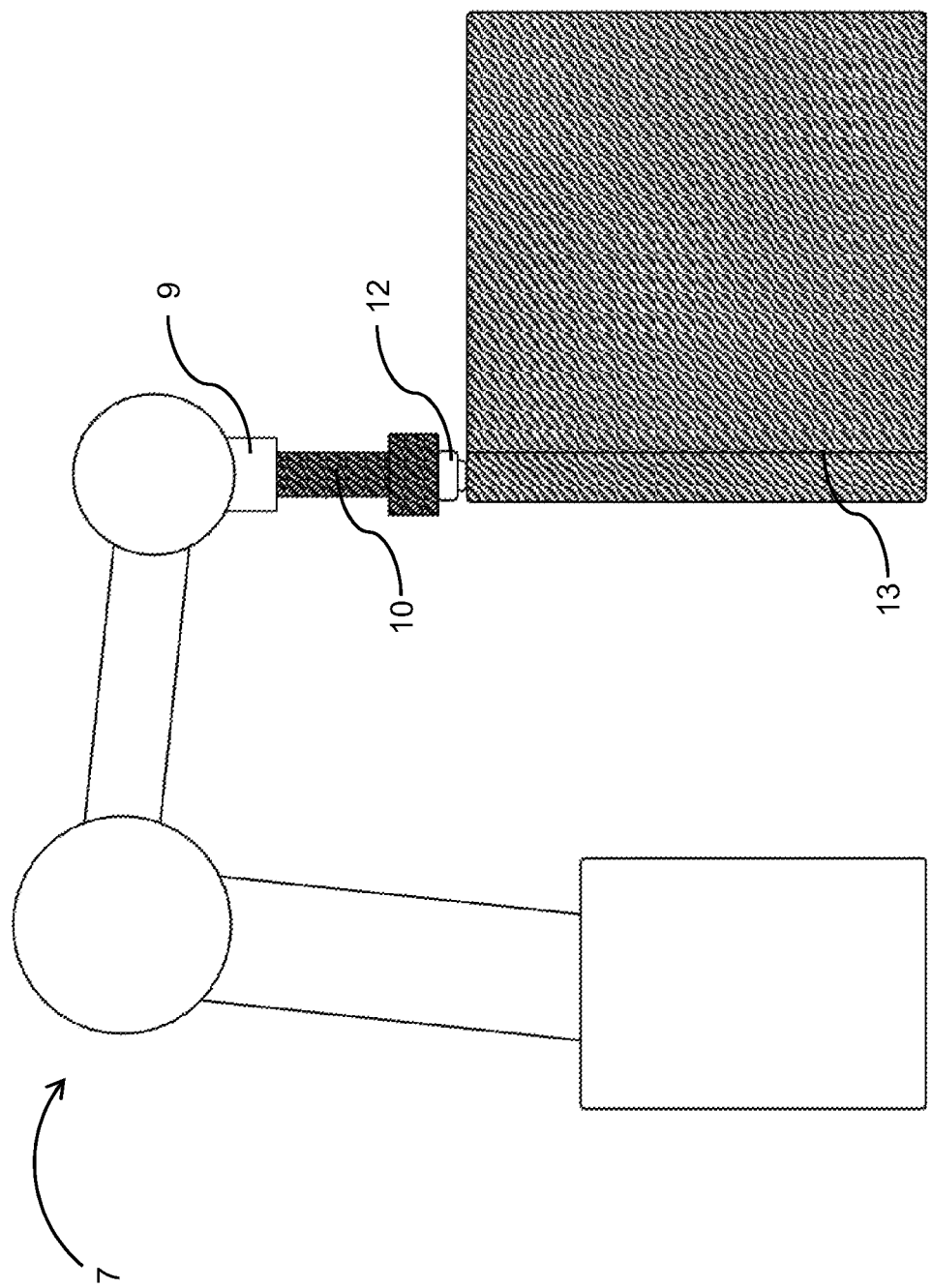

According to FIG. 9, the operator activates the screwdriver 10, screws in the screw 12 and stops the screwdriver 10. The operator repeats the process and saves two redundant configurations T4 and T5, each at the end of the movement.

The previous configuration T2 and the new configuration T4 are used to compute the runtime constraint for the movement of the screw in a manner analogous to R1:

$$R2.R = \text{Cylinder}(R2.f(T2), R2.f(T4))$$

That is, the movement is terminated as soon as the screw 12 moves further than the operator has shown it.

In addition, a runtime constraint is computed for the force that the screwdriver 10 is supposed to apply to the screw 12. The process is analogous to G3:

$$R3.R = \text{Cube}(R3.f(T4), R3.f(T5))$$

The same configurations are used to compute a goal constraint. That is, the movement is successful, if the torque is in the range of torques taught by the operator. The calculation is carried out analogous to R3, but with a torque constraint function:

$$G4.R = \text{Cube}(G4.f(T4), G4.f(T5))$$

Figure 10:
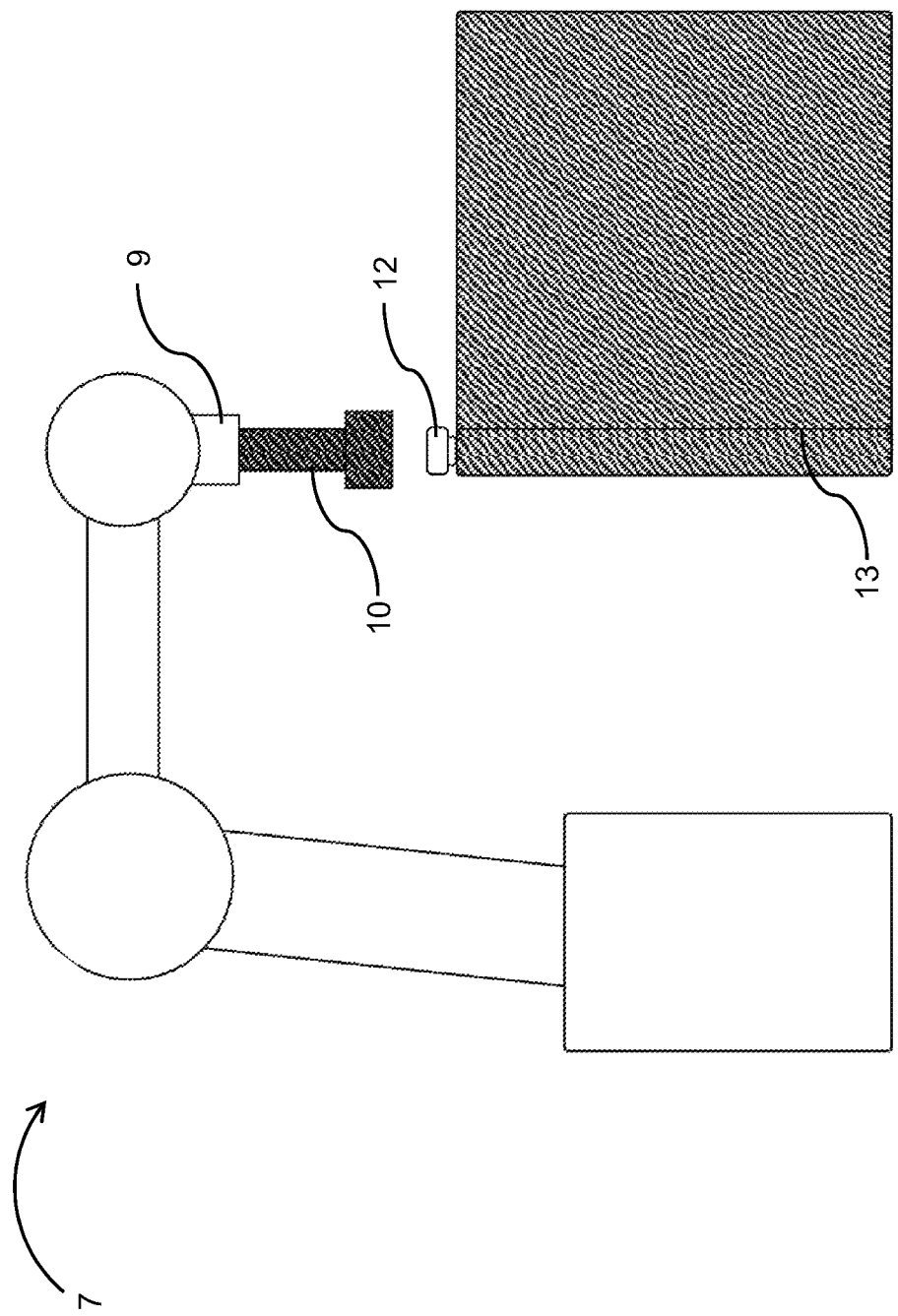

According to FIG. 10, the operator moves the robot 7 away from the screw 12 to the configuration T6. The previous configuration T5 and the configuration T6 are used to compute a goal constraint in a manner analogous to G2:

$$G5.R = \text{Cube}(G5.f(T5), G5.f(T6))$$

That is, the robot 7 will make a relative movement upwards that corresponds to the distance from T5 to T6. In so doing, the robot 7 moves a safe distance away from the screw 12.

Figure 11:
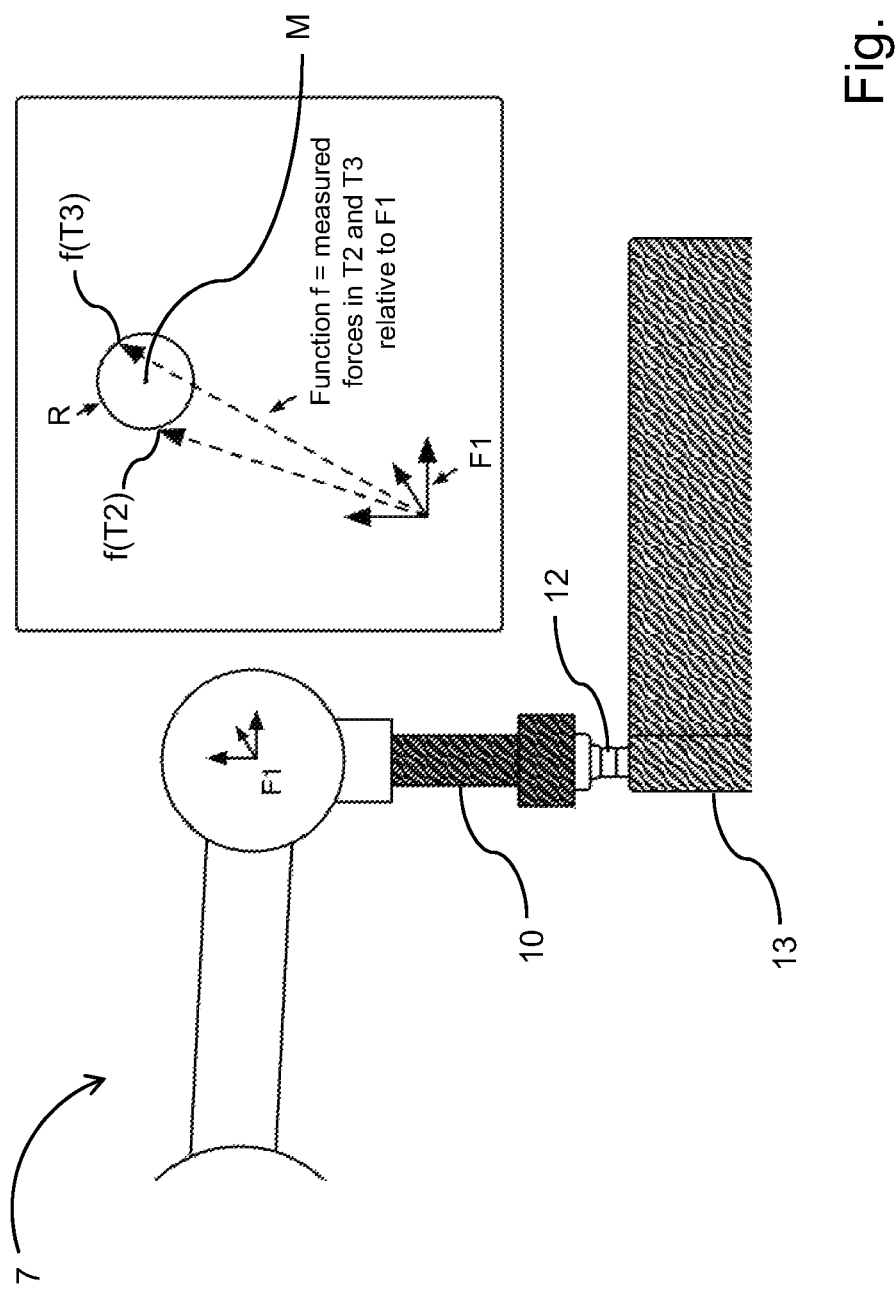
FIG. 11 a schematic view of an exemplary target region for an exemplary embodiment of a method or system of the invention.

FIG. 11 shows a schematic view of an exemplary constraint region for a force constraint function of a goal constraint for an exemplary embodiment of a method or system of the invention.

FIG. 11 is analogous to the recording step from FIG. 8 for calculating $$G3.R=\text{Cube}(G3.f(T2),G3.f(T3))$$

on the basis of the configurations T2 and T3. In the configurations T2 and T3 all of the relevant information about the robot 7 is saved at the time that the teaching takes place, therefore, also the measured force values. For the goal constraint G3 the function f and the constraint region R are stored in the learning module with the free parameters that still have to be determined. In this case f is a force constraint function defined as the force measured as a 3 dimensional vector (fx fy fz) measured at the tool center point (TCP), in the present case at the end point of the screwdriver 10, relative to a reference coordinate system F1 (in the present case equal to the tool center point). The two values off are calculated for T2 and T3, i.e., f(T2) and f(T3).

In this example, the constraint region R is of the constraint region type: sphere, i.e., a sphere with a center point M and a radius. It is computed with the function sphere( ) from the two values of the constraint function in T2 and T3. As a result, the calculated radius corresponds to exactly the deviation from the mean value of the taught force values that the robot itself may permit during the control process. Thus, the operator can enhance the robustness of the execution by means of suitable configurations.

Figure 12:
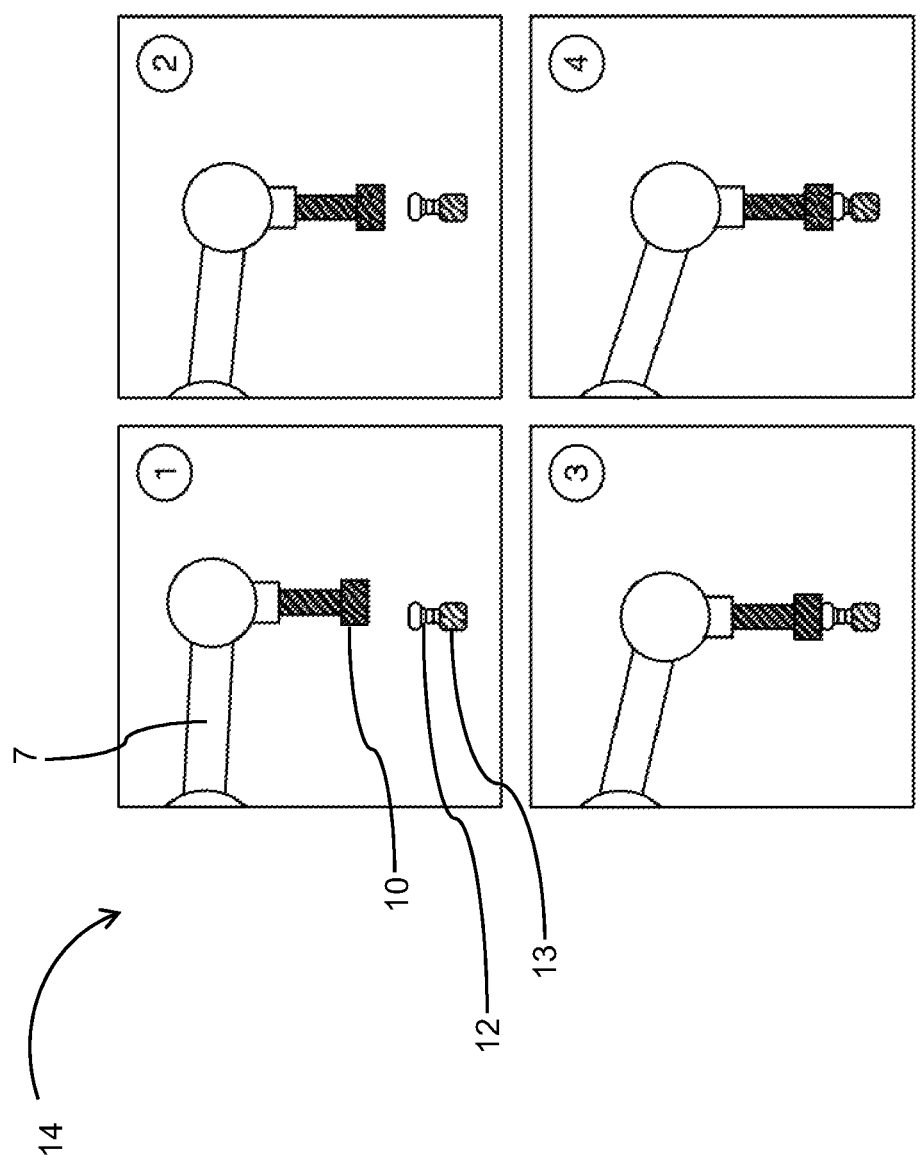
FIG. 12 an example of a graphic instruction for an operator for generating configurations, which are to be taught or, more specifically, recorded, in accordance with an exemplary embodiment of a method or system of the invention, and FIG. 13 a schematic view of the order of events of an initialization process or, more specifically, a teaching process by means of a learning module for generating the parameters for a motion template in accordance with an exemplary embodiment of a method or system of the invention.

FIG. 12 shows an example of a graphic instruction 14 for an operator or rather a user for generating configurations, which are to be taught or, more specifically, recorded, in accordance with an exemplary embodiment of a method or system of the invention. In the specific case an example of a graphic instruction is shown to the operator/user in the teaching process. The operator gets prototypical examples for configurations, which are to be taught or, more specifically, recorded, in similar applications (in 2D or 3D) and is led, preferably step-by-step, through the initialization process.

FIG. 13 shows a schematic view of the order of events of an initialization process or, more specifically, a teaching process by means of a learning module for generating the parameters for a motion template in accordance with an exemplary embodiment of a method or system of the invention. FIG. 13 comprises the representation of the order of events of the learning module for a motion template that performs a spiral search. The goal is to insert a gripped object 15 into a hole 16. If the location of the hole 16 is not exactly known, then the first step is to look for the hole 16. To this end, the motion template spiral search is used. In the spiral search the robot with the object 15 makes contact with the flat surface 17, in which the hole 16 is located. For this purpose the execution module MoveToContact that has already been described is employed. Upon contact, the robot performs a helical movement 18 and, in so doing, exerts force on the surface. If the spiral passes over the hole 16, the object 15 slides into the hole 16. The movement is terminated as soon as the object 15 has slid into the hole 16 by at least min and at most max millimeters, a state that is represented by a goal constraint.

a) The operator demonstrates in succession 4 configurations that define a region around the hole 16. The operator demonstrates three other configurations that define a region, in which the object 15 is to be moved into the hole 16 (see FIG. 13a).

b) The first four configurations are used to generate one runtime constraint and two goal constraints for MoveToContact in a manner analogous to FIG. 2. The goal constraint that is generated, with the type of constraint region cube, is used to generate a step-by-step spiral motion (see FIG. 13 b). The two spatial directions with the largest extension are calculated, for example, using the principal component analysis. Using an algorithm for generating a spiral, for example, an Archimedean spiral, a spiral is generated and scaled so that it is within the two largest extensions (see FIG. 13d).

c) The last two configurations are used to compute a goal constraint of the type location constraint function and the constraint region type cylinder (analogous to FIG. 9), FIG. 13c.

d) The robot moves on the spiral and stops the movement successfully if the goal constraint in accordance with FIG. 13c is satisfied, i.e., the object has slipped into the hole.

Advantageously, it is recognized in an inventive manner that the development of robot programs, which are tolerant of variances in the positioning and geometry of objects, should be significantly simplified compared to dialog-based and textual programming in order to achieve the aforementioned engineering objects or should solve the aforementioned problems for automation—and possibly the associated advantages, such as, throughput, repeatability, quality, etc.—as efficiently as possible. By implementing tolerance to variances in the robot program, the overall amount of engineering effort can be significantly reduced, for example, by means of simple, standardized feeders and gripper systems that are also preferably suitable for human operators, so that automation becomes economically feasible.

According to the invention, in order to program a robot, in particular, a robot comprising a robot arm, a movement to be performed by a robot is set up, preferably in a robot program, by means of a predefined motion template. The motion template is selected from a database comprising a plurality of motion templates, wherein the motion template comprises, according to the invention, one or more parameterizable execution modules and at least one learning module. The one or more execution modules are used for planning and/or executing the robot movement or a partial movement of the robot movement. The learning module records one or more configurations of the robot in an initialization process, for example, in the form of a teaching process. Based on the recorded configurations, the learning module calculates parameters for the one or more execution modules, preferably using a machine learning method, such as, for example, the RANSAC algorithm or the principal component analysis.

The drawback with the traditional teach-in and playback programming methods is that only waypoints and paths can be generated, but not information as to whether or how these waypoints or paths would have to be adapted in order to tolerate or, more specifically, to compensate for variances.

In contrast to approaches that take into account variations during the execution of the motion paths by defining the movement corridors, the inventive method and the inventive system respectively can take into account that not only are there variations in the motion path, but that a variety of different variations, which occur, for example, due to the temporal change in the gripper positions and/or the measured forces and in various process steps, must also be taken into consideration.

Consequently the inventive method and the inventive system as well as the inventive computer program product make possible a simple and robust programming of a robot, in particular, for a manipulator process and/or an assembly process.

In an advantageous manner the parameters of the execution module(s) may include constraints, where in this case the robot movement or a partial movement of the robot movement is planned and/or executed on the basis of the constraints. Thus, the result is a variable and dynamic planning of a robot movement or a partial movement of the robot movement, so that it is possible to implement an execution of the robot movement that is as robust and flexible as possible, in particular, with respect to any variances in the movement.

In an additional advantageous manner a constraint may include a constraint function f and a constraint region R, where in this case the constraint function f maps a configuration k into a preferably real-valued vector space, and wherein the constraint region R corresponds to a subset of a preferably real-valued vector space. A constraint for a configuration k is satisfied, if f(k) is located in R. Thus, a uniform implementation of very different kinds of constraints is possible in a sophisticated way, an aspect that allows the path and the movement of the robot to be planned in an efficient way.

Furthermore, one or more of the following types may be used as a type for a constraint function f:
- angle, velocity and/or acceleration of the joint of the robot or an end effector, in particular, a gripper, of the robot;
- position, orientation and/or location of a tool center point of the robot relative to a coordinate system;
- velocity, angular velocity and/or twist measured at a tool center point relative to a coordinate system;
- force, torque and/or wrench measured at a tool center point relative to a coordinate system;
- freedom from collision, distance magnitude and/or distance vector from one CAD model to another CAD model;
- grip rating of an end effector, in particular, of a gripper, of the robot and a CAD model.

Thus, by using one of the above types, or by combining several of the aforementioned types for one or more constraint functions, it is possible to consider as comprehensively as possible and to compensate for various kinds of variances in the planning and execution of the robot movement.

In one advantageous embodiment a type that can be used for a constraint region R includes an axis aligned cube, an oriented cube, a cylinder, a cone, a sphere, a convex hull, a CAD model, an ORing, an ANDing and/or a product formation. The ORing, ANDing and product formation combine at least two constraint regions into a single constraint region. Thus, it is possible, depending on the application and type of a constraint function, to select the appropriate range of values through a suitable application of the appropriate type for the associated constraint region.

The parameters of the execution module(s) may advantageously include runtime constraints as the constraints, where in this case a runtime constraint is a time-dependent constraint that defines a constraint to be satisfied for a predeterminable interval of time points.

Furthermore, the parameters of the execution module(s) may include goal constraints as the constraints, where in this case a goal constraint is a constraint that defines a constraint to be satisfied for an upper interval limit of a or the predeterminable interval of time points.

Therefore, the set of runtime constraints and goal constraints of a constraint-based movement description can model—directly—admissible variances that may occur during the execution of a manipulator process or an assembly process. Furthermore, runtime constraints and goal constraints constitute information as to how to compensate for larger variances. This aspect represents a significant improvement over traditional programming methods that do not provide such information.

In one advantageous embodiment the one or more execution modules can adapt or, more specifically, adjust the robot movement or a partial movement of the robot movement in compliance with a control algorithm in such a way that the runtime constraints are observed. Furthermore, the robot movement or a partial movement of the robot movement can be successfully terminated, when the goal constraints are satisfied. Consequently a robot performs a movement with success, when all of the runtime and goal constraints specified for the motion path, are met. The robot will adapt his movement in compliance with the control algorithms in such a way that the runtime constraints are observed. As soon as the goal constraints are met, the movement is successfully terminated. Otherwise, the execution is not successful.

A motion path can be calculated in a particularly advantageous manner on the basis of the constraints, in particular, on the basis of the runtime and/or goal constraints, for the execution module(s) of the motion template, preferably using a path planning algorithm.

The one or more execution modules may be mapped in an advantageous manner by compiling to a target system, for example, a robot controller. For this purpose executable robot code can be created on the basis of the respective type of control, the calculated motion path as well as the runtime and goal constraints. Then the robot code can be fully executed independently in the respective target system.

Furthermore, it is conceivable that in the initialization process the configurations to be recorded can be generated by a user by means of various interfaces, for example, by means of a manual guiding of the robot by the user, by means of mouse interaction in a 3D simulation environment and/or by means of other suitable control means.

In an advantageous embodiment interaction with a user may be effected in the initialization process, where in this case questions and/or instructions are put to the user in order to generate the configurations to be recorded. As a result, the user can be effectively supported during the initialization process or, more specifically, during the teaching process.

With respect to a simple and efficient structuring, the one or more execution modules may be constructed hierarchically in such a way that an execution module is designed as an indivisible primitive operator, i.e., as a primitive execution module, or is composed of one or more execution modules and/or one or more motion templates. Thus, any already existing and possibly parameterized motion templates or execution modules can be reused efficiently.

The inventive method enables a robust setup of robot programs, which are tolerant of variances in the positioning of workpieces and their geometry, and can be used advantageously in industry.

Such robot programs are not created directly in the form of commands in the robot programming language (as opposed to dialog-based, textual programming), but rather can be created on the basis of a database of predefined motion templates in an initialization process or, more specifically, teaching process. The motion templates can be created, analogous to teach-in, on the basis of a few configurations for a given process.

The motion templates comprise preferably an executable rule to detect and optionally to compensate for any variances in the process performed by the robot. At the same time the interpolation methods, used in teach-in, for generating motion paths between waypoints can be supplemented by path planning methods that can generate motion paths between (implicitly defined) waypoint regions.

A few aspects of the invention are explained in more detail below with reference to an exemplary implementation. It should be explicitly noted that the following statements describe only particularly preferred exemplary embodiments, but the teaching is not to be regarded as limited to these exemplary embodiments.

The teaching process may include, as an initialization process, in particular, the following steps:

1. Adding a motion template from a database to a robot program (or to an empty robot program), for example, inserting, spiral search, advance and grasp, contacting. For each motion template there may be one set of execution modules and one learning module. Each execution module has parameters, preferably including runtime and goal constraints. In this case a primitive execution module can correspond to a particular control algorithm, where known controller implementations, such as, for example, a hybrid force/position control, are expanded. The learning module implements machine learning methods in order to create the parameters from the taught configurations and/or from dialog-based inputs.

2. The learning module is executed. It may be construed as an extension of the teach-in programming method, in particular, to include the creation of runtime and goal constraints. Depending on the type of learning module, the learning module can send questions (graphically: 3D visualization on robot controller/external PC, dialog-based: 2D visualization) to the user or, more specifically, to the operator in order to create specific configurations. Later the learning module will calculate the parameters of the execution modules from the configurations. The user creates these configurations using various interfaces, for example, by guiding the real robot or by mouse interaction in a 3D simulation environment. For example, the real robot is moved in four configurations, which are supposed to define the four corners of a rectangle, or the user marks the corresponding four points on a CAD model. The configurations are recorded, for example, by means of the sensors, which are integrated into the robot arm, and the external force/torque sensor (FTS).

3. Machine learning methods are implemented in the learning module of a motion template. These machine learning methods calculate the parameters of the execution modules from the recorded configurations, which may include the robot arm position and/or gripper position and/or the force/torque measurements and/or points on a CAD model.

4. Based on the parameters, a motion path can be calculated for each execution module of the motion template, preferably using path planning algorithms, for example, the rapidly exploring random tree algorithm. This step is analogous to the teach-in method, in which a continuous path, for example, a linear connection between two waypoints, is generated on the basis of waypoints subject to the selection of types of interpolation. In the present case, continuous paths are generated, based on constraints, in particular, runtime and goal constraints, using planning algorithms.

5. The execution modules with parameters can be mapped to a target system, i.e., a robot controller, for example, using compilation. For this purpose executable robot code is produced on the basis of the respective type of control, the calculated motion path as well as the runtime and goal constraints. Then the robot code can be fully executed on the respective target system. In an alternative implementation the execution modules, in particular, the primitive execution modules, can be executed directly on a computer or, more specifically, a PC-based controller, without conversion into robot code.

In contrast to the traditional teach-in or playback methods, the parameters of the execution modules do not have to be waypoints or motion paths, but rather may represent runtime and goal constraints, both of which can be uniformly defined as follows:

A constraint consists of a constraint function f (in German: Bedingungsfunktion), which maps a configuration k into a real-valued vector space, and a constraint region R (in German: Bedingungsregion), which corresponds to a subset of a real-valued vector space. A constraint for a configuration k is satisfied, if and only if f(k) is in R.

The following types can be used, for example, for a constraint function f:

angle, velocity and/or acceleration of the joint of the robot or an end effector, in particular, a gripper, of the robot;

position, orientation and/or location of a tool center point of the robot relative to a coordinate system;

velocity, angular velocity and/or twist measured at a tool center point relative to a coordinate system;

force, torque and/or wrench measured at a tool center point relative to a coordinate system;

freedom from collision, distance magnitude and/or distance vector from one CAD model to another CAD model;

grip rating of an end effector, in particular, of a gripper, of the robot and a CAD model.

With respect to a position constraint function, an orientation constraint function or a location constraint function (pose constraint), a constraint function f constitutes the current location of the tool point (tool center point TCP) relative to a specific (predefined) coordinate system K as a 3 dimensional vector (position constraint, orientation constraint) or as a 6 dimensional vector (location constraint).

In the context of one exemplary embodiment the calculation of the location constraint function consisting of a 3 dimensional vector of the position and a 3 dimensional vector of the orientation may be described as follows. Position and orientation constraints consist only of the respective 3 dimensional vector.

If H is the homogeneous transformation matrix that describes the location of the TCP relative to K, then the 6 dimensional vector is formed by the 3 dimensional translation vector of H and the 3 dimensional, scaled rotation axis of H (axis-angle representation). The scaled rotation axis of H can be calculated as follows:

1. The 3×3 rotation matrix of H is converted into a quaternion (qx, qy, qz, qw), where qw is the real part.
2. The angle of rotation a (alpha) is 2*acos (qw). Acos is the arc cosine function.
3. The scaled rotation axis is a*1/sin(a)*[qx qy qz]. [qx qy qz] is the 3 dimensional vector, consisting of qx, qy and qz.

A velocity constraint function, an angular velocity constraint function and a twist constraint function can be calculated in an analogous manner (twist=6 dimensional vector consisting of a 3 dimensional velocity vector and a 3 dimensional angular velocity vector). In this case, however, the 3 dimensional (translation) velocity and the 3 dimensional angular velocity of the TCP relative to a specific coordinate system K are transformed in accordance with the transformation rule for velocity vectors and saved as the value of the constraint function.

The force, torque and wrench constraint functions may also be treated in the same way as in the previous section. At the same time the force, the torque or the combination of force and torque (wrench) are calculated.

The joint angle constraint function, the joint velocity constraint function and the joint acceleration constraint function represent directly the n dimensional vectors of the current position, the velocity and the acceleration of the degrees of freedom of motion in the robotic system.

A freedom-from-collision constraint function can be implemented in such a way that it outputs 1 as the value, if there is a collision of the 3D CAD models of the surrounding area with the 3D CAD models of the robot or a collision of the robot with itself. This calculation of the collision can be carried out, inter alia, by intersecting the triangular meshes of the 3D CAD models, to which end, if necessary, the standard libraries may be used. If there is no collision, 0 is returned.

A distance magnitude constraint function calculates preferably the Euclidean distance of a 3D CAD model from a second 3D CAD model as the distance between the pair of points that complies with the two points of the first and second 3D model with the shortest possible distance from one another. A distance vector constraint function calculates preferably the normalized vector from the first to the second point of the same pair of points.

A location constraint may be realized or implemented, for example, as follows: let the coordinate system K be defined at the center of gravity of an object. Then the relative location of the TCP relative to K as a 6 dimensional vector is calculated according to the above formula. R is a 6 dimensional cube given as the center point vector [m1 m2 m3 m4 m5 m6] and the variance vector [e1 e2 e3 e4 e5 e6]. The cube complies with all of the vectors [v1 v2 v3 v4 v5 v6], where mi−ei<=vi<=mi+ei. The constraint implies that the tool center point and, thus, also the robot arm position, has to be in a specific region, for example, above the object to be grasped. In this case the coordinate system K is defined at the center of gravity of the object. In this case possible values of R would be:

[m1 m2 m3 m4 m5 m6]=[0 0 0.05 1.5708 0 0] and

[e1 e2 e3 e4 e5 e6]=[0.01 0.01 0 0 0 0].

The constraint region is located 0.05 m above the center of gravity of the object with an orientation of approx. 90 degrees, equivalent to 1.5708 rad, rotated about the X axis. Allowable deviations from this point are 0.01 m in the X and Y directions.

A force constraint (in German: Kraftbedingung) can be implemented as follows: the force measured with the FTS is shown as a 3 dimensional vector [fx fy fz]. The constraint region R is a 3 dimensional sphere R having a radius r and a center point vector [m1 m2 m3]. The force constraint is satisfied, if and only if [fx fy fz] is located in R, i.e., $$\text{norm}([fx-m1\,fy-m2\,fz-m3])<=r.$$

In this case norm is the Euclidean norm of the vector. Thus, the force constraint is satisfied, if and only if the amount of force is less than or equal to r.

In the context of a preferred embodiment of the invention a constraint function should or must satisfy one or more of the following calculations, where K is a configuration, and r is a real-valued vector with a dimension equal to the dimension of R(k):
1. f(k)=r, i.e., the function f can be applied to the configuration k. It must be fulfilled for all functions f.
2. $f^{-1}$ (r, k')=k, i.e., if a value r and a reference configuration k' are given, then a configuration k that fulfills f(k)=r can be calculated. (calculation B.1)
3. f(k) can be incremented by means of r, i.e., if a configuration k and a vector r are given, then a configuration k' can be calculated, so that f(k')=f($f^{-1}$ (f(k)+r)), i.e., the configuration k is modified in such a way that the modification corresponds to a given step r in R.

According to an exemplary embodiment, a constraint region defines a real-valued range of values R. In this case R should or must allow one or more of the following calculations. r is a real-valued vector with a dimension equal to the dimension of R:
1. Real-valued distance d>=0 from r to R: d is 0, if r in R, otherwise the minimum distance from r to the surface of R (calculation B.2).
2. Real-valued distance d from r to the surface of R: if r is in R, then d is the negative value of the minimum distance from r to the surface of R. Otherwise d is the minimum distance from r to the surface of R.
3. Include e=0 or 1. e is 1, if and only if r is in R. This calculation must be fulfilled by all of the constraint regions.
4. The center point m of R. This calculation must be fulfilled by all of the constraint regions.
5. Random point on the surface r. A random vector r can be calculated, so that r lies on the surface of R.
6. Random point from the internal space. A random vector r can be calculated, so that r is in R. (calculation B.3)
7. Calculation of the extension of R in any direction v. (calculation B.4)

In this case the types of R that can be used include: axis aligned cube (axis aligned bounding box), oriented cube (oriented bounding box), cylinder, cone, sphere, convex hull, CAD model, ORing, ANDing and/or tupel formation.

As a result, the set of runtime constraints and goal constraints of a constraint-based movement description can model directly the allowable tolerances that can occur in the course of executing a robot program, for example, an assembly process. Furthermore, they represent information as to how to compensate for larger variances, an aspect that constitutes a significant improvement over traditional programming methods that do not provide such information.

A possible compensation for larger variances will be described in more detail below. In this case a distinction is made between motion planning and control.

In the context of motion planning the goal is to generate a motion path that satisfies a constraint-based movement description. In this case the algorithm constraint-based bi-directional rapidly exploring random tree (CBiRRT) by Berenson et al.: "*Manipulation Planning on Constraint Manifolds*", IEEE International Conference on Robotics and Automation (ICRA '09), May 2009, can be combined with the projection method randomized gradient descent (RGD) by Stilman, M: "*Task constrained motion planning in robot joint space*," Intelligent Robots and Systems, 2007, and can be adapted to the runtime and goal constraints. Then the path planning algorithm comprises the following steps:
1. Generating target configurations, i.e., configurations, for which all of the goal constraints are met. Since the set of target configurations generally include more than one element, the issue in this case concerns allowable deviations, for example, from a place at which the robotic system can put down an object.
2. Searching for a piecewise linear connection from a starting configuration to the generated target configurations. In this step a motion path is generated that runs from the starting configuration to one of the target configurations. As a result, the robotic system is able to independently generate a valid motion path within the variances that are given in the form of runtime constraints in a goal-oriented manner.

However, it is possible to provide initially, as a basis for the calculation of the target configurations and the search, a projection method that maps a configuration, in which not all of the constraints are satisfied, to a similar configuration that satisfies all of the constraints. To this end, a randomized gradient descent (RGD) can be implemented with constraints as the projection method. The goal is to map a configuration k to a configuration k', so that a given set of constraints in k' are satisfied, and k' is not further away from k than d>0. That means that, therefore, the proposed projection method allows a configuration k, in which a set of constraints are violated, to be modified at least until the constraints are met. In this respect the RGD algorithm is used with a special distance function.

The distance function dist( ) may be defined as follows: given the configuration k and a set of constraints b1 to bn:
1. Compute for each bi a distance value di: let f be the constraint function; and R, the constraint region of bi. If R supports the distance calculation (see calculation B.2), then it holds that di=minimum of MAX and distance of f(k) to R. If R does not support the distance calculation, then di=0, if f(k) is included in R. Otherwise, di=MAX. MAX is a constant>0, in the present case: 100,000.
2. Form the maximum dmax of all distance values di.
3. The value of the distance function for the configuration k is dmax.

The RGD algorithm projects a configuration k onto a configuration k', in which all of the constraints bi are satisfied by performing a randomized gradient descent. That being the case, the following process is performed. Let e be greater than 0 (e>0); and let k' be equal to k (k'=k) at the beginning:

Function bool RGD(k, bi, k'):
1. Set COUNTER=0
2. If COUNTER>MAXIMUM, terminate with the return value false.
3. Create after a uniform distribution m direction vectors si of the dimension of the configuration k. Set the configuration ki=k'+e*si. Compute vi=dist(ki) for all ki.
4. Determine the argument j with minimum value (argmin function) of all vi.
5. If vj=0, set k'=kj and terminate with return value true.
6. If vj>=dist(k), set COUNTER=COUNTER+1 and go to 2.
7. If norm(k-k')>d, set COUNTER=COUNTER+1 and go to 2.
8. Set k'=kj.
9. Go to 2.

Then the target configurations can be generated in a multistage process. Given bi=(fi, Ri) are the given goal constraints with constraint function fi and constraint region Ri:

1. Determine the constraints bj from bi, so that fj can be inverted (see calculation B.1) and Rj supports the calculation of random vectors (see calculation B.3).
2. Iterate through all bj:
    a. Compute a random value rj from Rj in accordance with calculation B.3.
    b. Compute kj=$f^{-1}$(rj, k).
3. If RGD(k, bi, k') is true, then add k' to the set of target configurations.

With regard to the search for a piecewise linear connection from a starting configuration k0 to the set of target configurations kj, the CBiRRT algorithm can be used with the following modification: the step ConstrainConfig (kold, knew) is replaced by RGD (kold, bi(t), knew). In this case bi(t) are the runtime constraints at the time point t, which is incremented so as to keep pace with the planning process.

The end result of the path planning algorithm is a sequence of time points with configurations (t1, k1), . . . , (tm, km), so that k1 corresponds to the starting configuration; and km to one of the target configurations from the set of target configurations. In this case the runtime constraints in k1 to km−1 are satisfied. The goal constraints in km are satisfied.

In order to provide a suitable control in accordance with an exemplary embodiment, the control algorithm hybrid position and force control can be further developed in order to be parameterized on the basis of the runtime and goal constraints. In this case the interpretation of the runtime and goal constraints is as follows:
1. Runtime constraints, which must be observed with the use of control
2. Goal constraints which interrupt, when they are met, the execution In the context of the exemplary embodiment, the control algorithm is provided, as a proportional-integral-differential controller (PID controller) implemented in the six dimensions x, y, z, rx, ry and rz. The major difference between the hybrid position controller and the force controller is in the error calculation, which replaces the selection rule that is commonly used. The control algorithm supports the runtime constraints with the position, orientation, location, force, torque or wrench constraint function. These constraint functions have a uniform construction and are based on the location or wrench at the TCP relative to a specific coordinate system K.

The update step of the PID controller can be implemented as follows:
1. Iterate through all runtime constraints.
2. Compute for the current configuration K the value f(k) of the constraint function f of the current runtime constraint.
3. The error calculation in the PID controller is carried out for each dimension, x, y, z, rx, ry and rz individually. In so doing, the following steps are carried out in each dimension i:
    a. Compute the distance d from f(k) to the center point of the region m at coordinate i.
    b. Compute in accordance with calculation B.4 the extension ai of the constraint region R in the direction that is given by i. At the same time it is explicitly possible that the extension is infinite, for example, in the case of a 2D plane.
    c. If the amount di is less than ai, then set the error ei to 0. Otherwise, the error ei=ai−di.
    d. Apply the PID update to the error ei and compute the desired value si.

4. Transform the target vector s=[s1 s2 s3 s4 s5 s6] into the TCP in accordance with the transformation rules of the constraint function.
5. If a force, torque or wrench constraint function is given, then convert the target vector with a given spring constant, according to the principle of the spring force, into a target location vector.
6. Compute the sum of the target vectors and transformed target location vectors of all runtime constraints.
7. Move the robot relative to the computed sum.

Hence, the robot performs either a position control, a force control or a simultaneous position and force control in a given dimension i as a function of the current runtime constraints.

The control process is terminated, when all of the goal constraints in the current configuration are met.

In addition, the control algorithms can be easily expanded to the use of goal constraints, for example, a position control in the joint angle space and/or in Cartesian space or a force control. In this case the current configuration k is calculated in the control loop. The control process is successfully terminated, when all of the goal constraints in k are met.

According to one exemplary embodiment of the invention, runtime and goal constraints constitute a particularly advantageous parameterization for generating motion paths by means of path planning and control, which can explicitly model the allowable variances and, therefore, can result in an increase in robustness. Programming by means of runtime and goal constraints is the preserve of only experts in robotics due to the algorithmic complexity. Therefore, the motion templates, which combine the execution modules with learning modules, are used in a sophisticated way. The execution modules can be parameterized by means of constraints, in particular, by means of runtime and goal constraints. Learning modules can use simple machine learning algorithms to generate runtime and goal constraints from a few configurations as the parameters for the execution modules. The learning module in itself represents a process that leads an operator step by step, for example, with the assistance of schematic representations of a few configurations, through the generation thereof. As a result, even non-experts can easily create robot programs for tasks that in the past required time consuming and complex textual programming of termination criteria or target criteria.

The movements of a robot are described by means of motion templates. A motion template consists of one or more execution modules and a learning module. Each execution module is either a primitive operator (basic operator), i.e., it cannot be broken down any further, or it consists of multiple execution modules (macro operator). That being the case, there are at least two classes of execution modules: controller (in German: Regler) and path planner (also motion planner). Path planners generate a motion path based on runtime and goal constraints. Controllers are of the type of the described position controllers in the joint angle space, position controllers in the Cartesian space, force controllers or expanded hybrid position/force controllers. Controller or, more specifically, closed loop controllers process the runtime and goal constraints, which are generated during execution of a motion path.

Execution modules can be parameterized by means of a set of runtime and/or goal constraints. The runtime and goal constraints, which are stored in the motion template, are preferably only partially parameterized. For each constraint not only the type of constraint function f, but also the type of constraint region R is fixed. The parameters of the constraint function are free, thus, for example, the coordinate system K for the location constraints or the location of the TCP. Similarly the parameters of the constraint region, i.e., for example, the center point, orientation and extension of an axis-oriented cube, are free. The free parameters are calculated by means of the learning modules.

The goal with regard to the interaction with a user or, more specifically, an operator as part of the initialization process or the teaching process is a schematic representation of the configuration to be generated, so that the user creates a semantically correct configuration for the calculation of the free parameters of the execution modules. For example, the user must establish contact with an object in order to enable a force measurement with the FTS.

The presentation is carried out in schematic form, since the motion templates are loosely defined and independent of the actual appearance of the objects, the gripper or, more specifically, the robot.

The schematic representation can be carried out in several ways:
1. presenting a video with a real and/or computer-animated representation of the execution of the motion template and/or the process of generating the configuration in a prototypical example of the motion template. In the latter case the individual steps, i.e., the individual configurations to be generated, are highlighted, for example, by pausing in the video.
2. using a dialog system to lead the user step by step through the process of generating a configuration, so that the user can take back configurations, which are already generated, and can repeat parts of the process. For each configuration to be generated, at least one dialog box is shown with a schematic visualization of the configuration which is to be generated, in a manner analogous to 1.

The free parameters can be computed by the learning modules based on the configurations Ti. In this case the type of constraint region and the constraint function are given.

If T1 to Tn are the configurations for computing the free parameters of the constraint b=(f, R), then it holds:
1. Compute f(T1), f(Tn).
2. Specify a quality function g(Rp)>=0 that assigns a numeric value to a constraint region Rp without free parameters. In the work under discussion, g(R) =weighted sum of volume and surface of the region R.
3. Use a non-linear optimization method, for example, the Simplex or Rosenbrock algorithm to solve the following optimization problem: find values for the free parameters of R, so that Rp with respect to g(R) is minimal, and f(T1) to f(Tn) are included in Rp.

The use of a given learning module for a motion template, which is parameterized preferably to some extent, makes it possible to determine the runtime and goal constraints with only a small set of configurations, an aspect that leads to a reduction in the programming time, and at the same time makes it possible to check the process results, a feature that is required or, more specifically, is particularly advantageous for robust industrial use.

Compared to textual or dialog-based programming, the programmer does not have to enter directly the parameters of the movement commands; instead, these parameters are calculated automatically from the preceding teaching process.

Each type of control and each target system may have compiling rules that convert the execution module into executable robot code. In so doing, the evaluation of goal constraints is modeled directly in the robot code. Runtime constraints are simulated as a function of the type of controller. In the case of position controllers only runtime constraints that affect the location or joint angle of the robot arm are adjusted (for example, with the methods described above). In the case of force controllers, runtime constraints for the measured FTS values are adjusted. In the case of hybrid position/force control runtime constraints are considered for the position and FTS values. At the same time the constraint region R is analyzed to determine the spatial axes that are force or position controlled. An extension in a particular spatial axis greater than a threshold value is evaluated as an infinite extension. Spatial axes with an infinite extension are not position controlled in position constraints and are not force controlled in force constraints.

The inventive method and/or the inventive system and/or their various advantageous embodiments constitute an expansion of the traditional teach-in to include robot programs with the need to take account of variances. The result is an executable program that includes not only movement commands, as in the case of teach-in, but also in which a movement command still has preferably runtime and goal constraints. The integrated control algorithms change the robot movement as a function of the type of controller in order to observe the runtime constraints and to achieve the goal constraints. Thus, the possible advantageous embodiments described above make it easy to create robot programs with control strategies that otherwise can be created manually, and then only in a very time consuming way by means of dialog based or textual programming.

Thus, possible process steps include: teaching configurations based on templates, computing runtime and goal constraints, computing a prototypical motion path, mapping to control processes with runtime and goal constraints, compiling in order to generate robot code.

The aforesaid replaces an analogous process in the dialog-based or textual programming method, where the programmer develops a control process in the programming language and manually defines its parameters for a task at hand; he creates and parameterizes the target and termination constraints in the programming language. Starting poses and intermediate points are generated on the robot by means of teach-in.

In contrast, the inventive method and the inventive system and/or its advantageous embodiments make it possible to create complex robot programs in a faster way and at the same time with fewer demands on the operator, so that applications that have not been automated to date for economic or complexity reasons can now be automated. In addition, partial solutions that are generated, i.e., sets of parameterized motion templates, can be easily reused, because they can be easily adapted by modifying the individual configurations with the learning modules.

Specifically there is no longer any need in the case of the defined task profile, for example, an average assembly task, for the programmer to create by hand in a time consuming way the target and termination criteria for a large number of movement commands by means of a dialog-based or textual programming interface. Instead, this procedure is replaced by a simple and sophisticated creation of the robot program from a set of motion templates and, in addition, the teaching of a few, well-defined configurations for each learning module. The resulting robot program automatically includes the target criteria and the termination criteria in the form of runtime and goal constraints. Therefore, in contrast to teach-in or playback, a particular waypoint does not have to be approached, but rather the movement can be executed with success, if the constraints are met, i.e., for example, if a waypoint can be approached from a region, with the result that the execution is more flexible. In addition, information as to how to compensate for a variance is present in the form of constraints. Therefore, the robot program is tolerant of variances corresponding to the extension of the constraint region.

Some examples of advantageous definitions for use in the context of preferred embodiments of the invention are given below.

In the path planning literature, a configuration (in German: Konfiguration) is a unique and unambiguous description of the state of a robotic system. In the present case, therefore, a configuration may be given as an n dimensional, real-valued vector, which includes the following information:

the values of all controllable and non-controllable degrees of freedom in the robotic system, i.e., six joint angle values in a six-axis industrial robot the values of all controllable and non-controllable degrees of freedom in the tools mounted on the robot, i.e., a value for the gripper jaw position for an electric jaw gripper the values of the recorded sensor data of the sensors mounted on the robot, i.e., in the case of a six dimensional force-torque sensor three values for the forces, measured in the spatial direction x, y and z, as well as three values for the torques, measured in the spatial direction x, y and z a value for the time point t A configuration space (in German: Konfigurationsraum) is the set of all configurations that can occupy the robotic system. In this case physical boundary constraints, such as, for example, a controllable joint angle position, which leads to a self-collision of the robot, are ignored. If a configuration consists of n coordinates and each coordinate can assume values between $L_i$ and $U_i$, then the configuration space is defined as the hypercube with dimension n and edge lengths $U_i$–$L_i$ as well as center point $(L_i+U_i)/2$.

A motion path (motion) can be specified as a function b, which assigns a configuration to each point of the closed interval from 0 to 1 and is continuous. The value of b at the point 0 is the starting configuration. The value of b at the point 1 is the target configuration. Therefore, a motion path is a continuous connection in the configuration space.

A constraint (in German: Bedingung) can be specified as a function g that assigns the value of 0 or 1 to a configuration k. A constraint g is said to be satisfied in the configuration k, if and only if $g(k)=1$. Otherwise, the constraint has not been satisfied.

A runtime constraint (in German: Wahrendbedingung) can be specified as a time-dependent constraint. That is, it defines a constraint for each time point t. It is applied to the values of a motion path at the points greater than or equal to 0 and less than 1. A runtime constraint $g(t)$ on a motion path b is met, if and only if $g(t)(b(t))=1$ is for all $t>=0$ and $t<1$.

A goal constraint (in German: Zielbedingung) can be specified as a constraint that is applied to the value at the point 1 of a motion path. A goal constraint g on a motion path b is satisfied, if and only if $g(b(1))=1$.

A constraint-based movement description (also constraint-based motion representation) can be defined as a set of runtime constraints and a set of goal constraints. A motion path satisfies a constraint-based movement description, if all of the runtime constraints and all of the goal constraints on the motion path are met.

In the course of executing a robot movement using runtime and goal constraints, motion paths can be generated, for example, as follows: through the use of motion planning and/or through the use of control. In the case of motion planning, a motion path is generated before the execution on the robot. In the case of control, a motion path is generated by means of a control algorithm during execution. In so doing, the starting configuration is constant and corresponds to the beginning of the movement. The target configuration is always the current configuration, in which the robot finds itself at the current time. As a result, the path generated with a control algorithm grows steadily. A robot performs a movement with success, if all of the runtime and goal constraints given for the motion path are met. The robot will adapt its movement in compliance with the control algorithms in such a way that the runtime constraints are observed. As soon as the goal constraints are met, the movement is successfully terminated. Otherwise, the execution is not successful.

Finally it is explicitly pointed out that the above described exemplary embodiments of the inventive method and the inventive system respectively are used only to elucidate the claimed teaching, but do not limit the teaching to the exemplary embodiments.

LIST OF REFERENCE NUMERALS AND SYMBOLS 1 robot program
2 motion template
3 execution module
4 execution module
5 learning module
6 operator
7 robot
8 computer
9 sensor
10 screwdriver
11 robot controller
12 screw
13 workpiece
14 graphic instruction
15 object
16 hole
17 surface
18 spiral movement
M center point
F1 reference coordinate system
PA1-PA14 program instruction
TS1-TS6 substep

The invention claimed is:

1. A method for programming a robot, said method comprising the steps of:
 establishing in a robot program a movement to be performed by a robot;
 selecting a predefined motion template for the robot program from a database comprising a plurality of motion templates, wherein the predefined motion template comprises one or more parameterizable execution modules and at least one learning module;
 planning and/or executing at least a portion of the movement of the robot via the one or more execution modules;
 recording, via the learning module, one or more configurations of the robot in an initialization process; and
 calculating, via the learning module, parameters for the one or more execution modules on the basis of the one or more recorded configurations.

2. The method, as claimed in claim 1, wherein the parameters of the one or more execution modules comprise constraints, wherein the robot movement or a partial movement of the robot movement is planned and/or executed on the basis of the constraints.

3. The method, as claimed in claim 2, wherein:
 a constraint comprises a constraint function f and a constraint region R,
 the method further comprises the step of mapping, via the constraint function f, a configuration k into a preferably real-valued vector space,
 the constraint region R corresponds to a subset of a preferably real-valued vector space, and
 a constraint for the configuration k is satisfied, if f(k) is located in R.

4. The method, as claimed in claim 3, wherein one or more of the following types are used as a type for a constraint function f:
 angle, velocity and/or acceleration of the joint of the robot or an end effector, in particular, a gripper, of the robot;
 position, orientation and/or location of a tool center point of the robot relative to a coordinate system;
 velocity, angular velocity and/or twist measured at a tool center point relative to a coordinate system;
 force, torque and/or wrench measured at a tool center point relative to a coordinate system;
 freedom from collision, distance magnitude and/or distance vector from one CAD model to another CAD model; or
 grip rating of an end effector, in particular, of a gripper, of the robot and a CAD model.

5. The method, as claimed in claim 3, wherein a type that can be used for a constraint region R comprises at least one of an axis-aligned cube, an oriented cube, a cylinder, a cone, a sphere, a convex hull, a CAD model, an ORing, an ANDing, or a product formation.

6. The method, as claimed in claim 1, wherein the parameters of the one or more execution modules comprise runtime constraints as the constraints, wherein a runtime constraint is a time-dependent constraint that defines a constraint to be satisfied for a predeterminable interval of time points.

7. The method, as claimed in claim 6, wherein the parameters of the one or more execution modules comprise goal constraints as the constraints, wherein a goal constraint is a constraint that defines a constraint to be satisfied for an upper interval limit of the predeterminable interval of time points.

8. The method, as claimed in claim 7, wherein the one or more execution modules adapt the robot movement or a partial movement of the robot movement in compliance with a control algorithm in such a way that the runtime constraints are observed.

9. The method, as claimed in claim 8, wherein the robot movement or a partial movement of the robot movement is successfully terminated when the goal constraints are satisfied.

10. The method, as claimed in claim 9, wherein a motion path is calculated on the basis of the constraints, in particular, on the basis of at least one of the runtime or goal constraints, for the execution module(s) of the motion template.

11. The method, as claimed in claim 10, wherein the motion path is calculated using a path planning algorithm.

12. The method, as claimed in claim 1, wherein the one or more execution modules are mapped by compiling to a target system, in particular, to a robot controller.

13. The method, as claimed in claim 1, wherein in the initialization process the configurations to be recorded can be generated by a user by means of various interfaces, in particular, by means of a manually guiding of the robot by the user, by means of mouse interaction in at least one of a 3D simulation environment or by means of other control means.

14. The method, as claimed in claim 1, wherein an interaction with a user is effected in the initialization process, wherein questions and/or instructions are put to the user in order to generate the configurations to be recorded.

15. The method, as claimed in claim 1, wherein the one or more execution modules are constructed hierarchically in such a way that an execution module is designed as a primitive operator or is formed by at least one execution module and/or at least one motion template.

16. The method, as claimed in claim 1, wherein the parameters are calculated using a machine learning method.

17. The method, as claimed in claim 1, wherein the robot comprises a robot arm.

18. The method, as claimed in claim 1, wherein the recording of the one or more configurations of the robot in the initialization process occurs in the form of a teaching process.

19. A system for programming a robot, said system comprising:
 a robot program;
 a database containing a plurality of predefined motion templates, each of the predefined motion templates comprising one or more parameterizable execution modules and at least one learning module; and
 one or more processors configured for:
  establishing in the robot program a movement to be performed by a robot;
  selecting one of the plurality of predefined motion templates for the robot program from the database;
  planning and/or executing at least a portion of the movement of the robot via the one or more execution modules of the selected one of the plurality of predefined motion templates;
  recording, via the learning module of the selected predefined motion template, one or more configurations of the robot in an initialization process; and
  calculating, via the learning module, parameters for the one or more execution modules on the basis of the one or more recorded configurations.

20. A computer program product comprising at least one non-transitory computer-readable storage medium having computer-readable program code portions embodied therein, the computer-readable code portions comprising at least one executable portion configured for:
 establishing in a robot program a movement to be performed by a robot;
 selecting a predefined motion template for the robot program from a database comprising a plurality of motion templates, wherein the predefined motion template comprises one or more parameterizable execution modules and at least one learning module;
 planning and/or executing at least a portion of the movement of the robot via the one or more execution modules;
 recording, via the learning module, one or more configurations of the robot in an initialization process; and
 calculating, via the learning module, parameters for the one or more execution modules on the basis of the one or more recorded configurations.

* * * * *